US011901966B2

(12) United States Patent
Park et al.

(10) Patent No.: US 11,901,966 B2
(45) Date of Patent: Feb. 13, 2024

(54) ELECTRONIC DEVICE COMPRISING ANTENNA MODULE WITH CONNECTOR FOR COAXIAL CABLE

(71) Applicant: Samsung Electronics Co., Ltd., Gyeonggi-do (KR)

(72) Inventors: Kwangbok Park, Gyeonggi-do (KR); Yongsang Yun, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 116 days.

(21) Appl. No.: 17/713,629

(22) Filed: Apr. 5, 2022

(65) Prior Publication Data

US 2022/0407559 A1 Dec. 22, 2022

Related U.S. Application Data

(63) Continuation of application No. PCT/KR2022/003781, filed on Mar. 17, 2022.

(30) Foreign Application Priority Data

Jun. 18, 2021 (KR) .................. 10-2021-0079617

(51) Int. Cl.
*H04B 3/06* (2006.01)
*H05K 7/14* (2006.01)
(Continued)

(52) U.S. Cl.
CPC ............. *H04B 3/06* (2013.01); *H01Q 1/2283* (2013.01); *H05K 1/0243* (2013.01);
(Continued)

(58) Field of Classification Search
CPC ...... H04B 3/16; H01Q 1/2283; H05K 1/0243; H05K 1/0277; H05K 7/1427; H05K 2201/10098
See application file for complete search history.

(56) References Cited

U.S. PATENT DOCUMENTS 10,797,391 B2 10/2020 Lee et al.
11,303,014 B2 4/2022 Lim et al.
(Continued)

FOREIGN PATENT DOCUMENTS

EP            3800733 A1    4/2021
KR   10-2015-0033977 A    4/2015
(Continued)

OTHER PUBLICATIONS

International Search Report dated Jul. 4, 2022.
Written Opinion dated Jul. 4, 2022.

*Primary Examiner* — Jaison Joseph
(74) *Attorney, Agent, or Firm* — Cha & Reiter, LLC

(57) ABSTRACT

An electronic device includes an antenna module including an antenna array, a radio frequency integrated circuit (RFIC) connected with the antenna array and a flexible printed circuit board connected with the RFIC, a connector disposed on the flexible printed circuit board, a communication processor disposed on a first printed circuit board, a coaxial cable electrically connecting the flexible printed circuit board and the communication processor through the connector, and a second printed circuit board configured to electrically connect the communication processor and the flexible printed circuit board. The communication processor provides a data signal to be transmitted to an external electronic device to the RFIC along a first path in the flexible printed circuit board through the coaxial cable and the connector, and provide a control signal to the RFIC along a second path in the flexible printed circuit board through the second printed circuit board.

20 Claims, 12 Drawing Sheets

(51) Int. Cl.
*H05K 1/02* (2006.01)
*H01Q 1/22* (2006.01)

(52) U.S. Cl.
CPC ......... *H05K 1/0277* (2013.01); *H05K 7/1427* (2013.01); *H05K 2201/10098* (2013.01)

(56) References Cited

U.S. PATENT DOCUMENTS

| | | | |
|---|---|---|---|
| 11,417,954 B2 * | 8/2022 | Kim | H04W 16/28 |
| 2018/0277929 A1 * | 9/2018 | Seo | H01Q 1/241 |
| 2018/0277934 A1 * | 9/2018 | Kim | H01Q 1/38 |
| 2019/0235571 A1 * | 8/2019 | Jang | H01Q 1/243 |
| 2019/0393919 A1 * | 12/2019 | Youn | H01Q 5/30 |
| 2020/0367359 A1 * | 11/2020 | Baek | H04M 1/0277 |
| 2021/0036434 A1 * | 2/2021 | Yeom | H04M 1/0277 |
| 2022/0407559 A1 * | 12/2022 | Park | H04B 3/06 |

FOREIGN PATENT DOCUMENTS

| | | |
|---|---|---|
| KR | 10-2020-0014601 A | 2/2020 |
| KR | 10-2020-0073745 A | 6/2020 |
| KR | 10-2020-0101256 A | 8/2020 |
| KR | 10-2021-0015563 A | 2/2021 |
| KR | 10-2021-0017066 A | 2/2021 |

* cited by examiner

ELECTRONIC DEVICE COMPRISING ANTENNA MODULE WITH CONNECTOR FOR COAXIAL CABLE

CROSS-REFERENCE TO RELATED APPLICATION(S)

This application is a continuation of PCT International Application No. PCT/KR2022/003781, which was filed on Mar. 17, 2022, and claims priority to Korean Patent Application No. 10-2021-0079617, filed on Jun. 18, 2021, in the Korean Intellectual Property Office, the disclosure of which are incorporated by reference herein their entirety.

BACKGROUND

Technical Field

One or more embodiments of the instant disclosure generally relate to an electronic device including an antenna module with a connector for a coaxial cable.

Description of Related Art

A portable electronic device, such as smartphone, laptop computer, or tablet personal computer, may establish a communication channel with an external electronic device, such as a base station or another portable electronic device. Depending on the state of the communication channel, reception performance of the external electronic device of the signal transmitted from the electronic device may change.

SUMMARY

A portable electronic device may include an antenna module. For example, the portable electronic device may include an antenna module for mmWave communication (e.g., in a bandwidth between about 6 GHz and 60 GHz). A signal line may be used to feed signals from a communication processor (CP) in the portable electronic device to an antenna (e.g., antenna array or antenna radiator) in the antenna module. As the signal line lengthens, attenuation in communication signals transmitted along the feeding signal line may occur.

A coaxial cable for transmitting signals to the antenna module may be connected to a connector of the antenna module. If the coupling between the coaxial cable and the connector is not stable, the communication signals passing through the connector may be at least partially lost.

The technical problems to be achieved in this document are not limited to those described above, and other technical problems not mentioned herein will be clearly understood to those having ordinary knowledge in the art to which the disclosure belongs, from the following description.

In accordance with an aspect of the disclosure, an electronic device is provided comprising: an antenna module including an antenna array, a radio frequency integrated circuit (RFIC) connected with the antenna array and a flexible printed circuit board connected with the RFIC; a connector disposed on the flexible printed circuit board; a communication processor disposed on a first printed circuit board; a coaxial cable electrically connecting the flexible printed circuit board and the communication processor through the connector; and a second printed circuit board electrically connecting the communication processor and the flexible printed circuit board, the second printed circuit board being distinct from the first printed circuit board. The communication processor is configured to: provide a data signal to be transmitted to an external electronic device, to the RFIC along a first path in the flexible printed circuit board through the coaxial cable and the connector, and provide a control signal to the RFIC along a second path in the flexible printed circuit board distinct from the first path through the second printed circuit board. The data signal provided to the RFIC is up-converted in the RFIC, based on the control signal. The up-converted signal is transmitted to the external electronic device through the antenna array.

In accordance with another aspect of the disclosure, an electronic device is provided comprising a housing including a first surface, a second surface facing the first surface, a third surface between the first surface and the second surface, and an inner space defined by the first surface, the second surface and the third surface; a first printed circuit board supported by the second surface and including a processor; a second printed circuit board spaced apart from the first printed circuit board and supported by the second surface; an antenna module including an antenna array and a flexible printed circuit board; a connector formed on one surface of the flexible printed circuit board; and a coaxial cable electrically connecting the flexible printed circuit board and the first printed circuit board via the connector, and configured to transmit a data signal from the processor to the antenna module. A part of another surface of the flexible printed circuit board is in contact with the second printed circuit board to be supported by the second printed circuit board and the connector may be disposed thereon.

The effects that can be obtained from the present disclosure are not limited to those described above, and any other effects not mentioned herein will be clearly understood to those having ordinary knowledge in the art to which the disclosure belongs, from the following description.

BRIEF DESCRIPTION OF THE DRAWINGS

The above and other aspects, features, and advantages of certain embodiments of the disclosure will be more apparent from the following description, taken in conjunction with the accompanying, in which.

DETAILED DESCRIPTION

An electronic device with a first connection path and a second connection path according to an embodiment can reduce signal loss that may occur in the first connection path. This may be done by configuring a portion of the first connection path for supplying feeding signals to an antenna module, with a coaxial cable.

An electronic device according to an embodiment can include a fixing member for maintaining the connection between the coaxial cable and a connector of the antenna module, so as to reduce signal attenuation that may occur in the connector.

An electronic device according to an embodiment makes it possible to minimize waste of the interior space of the electronic device used for installation of a fixing member of the coaxial cable or the connector. This may be done by forming the fixing member to extend from a housing of the electronic device.

Figure 1:
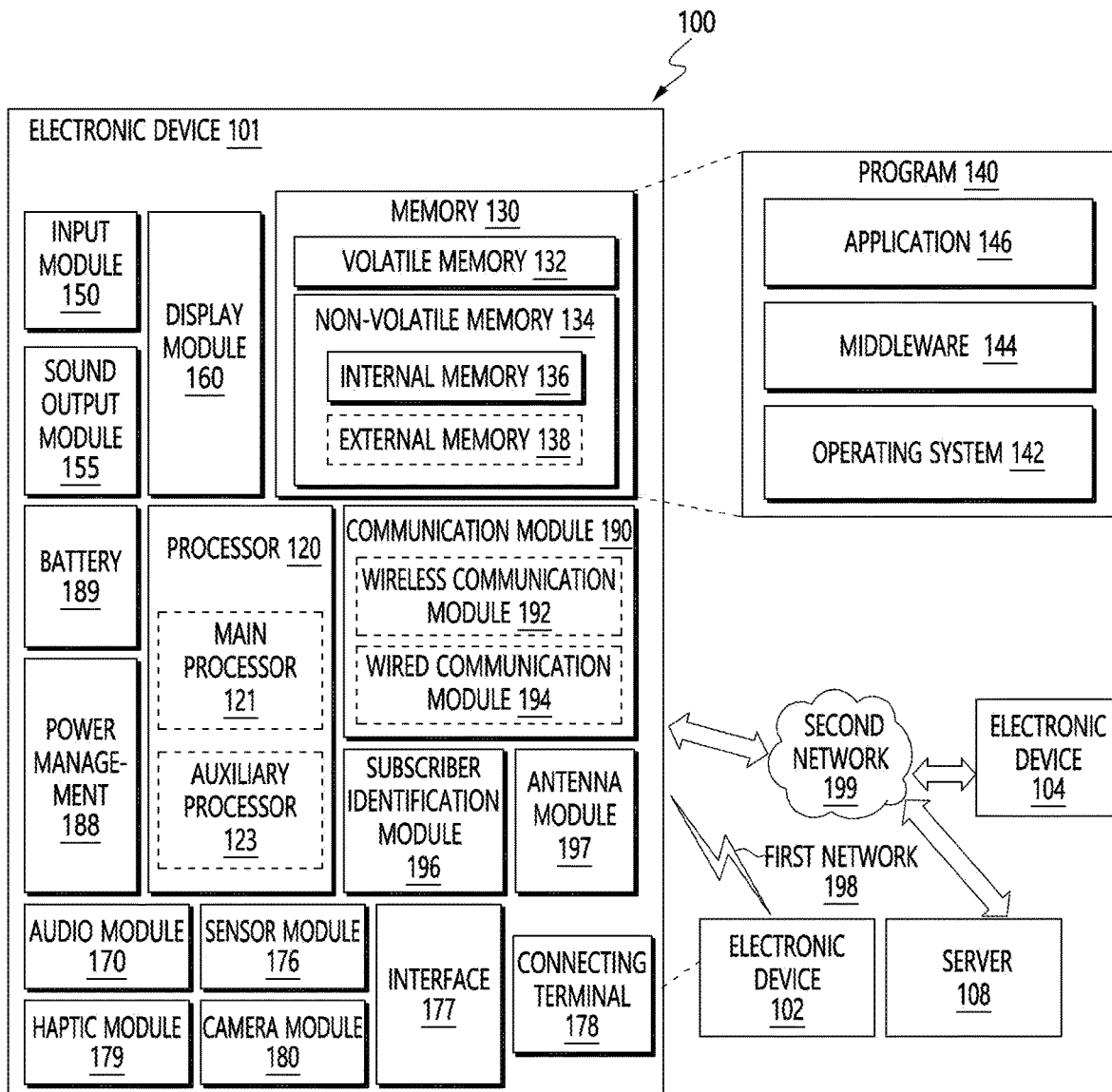
FIG. 1 is a block diagram of an electronic device in a network environment according to various embodiments.

FIG. 1 is a block diagram of an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment of the disclosure, the electronic device 101 may communicate with the electronic device 104 via the server 108. According to an embodiment of the disclosure, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one of the components (e.g., the connecting terminal 178) may be omitted from the electronic device 101, or one or more other components may be added in the electronic device 101. In some embodiments of the disclosure, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor adapted to detect a touch, or a pressure sensor adapted to measure the intensity of force incurred by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment of the disclosure, the interface 177 may include, for example, a high-definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to address, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., a printed circuit board (PCB)). According to an embodiment of the disclosure, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

According to certain embodiments of the disclosure, the antenna module 197 may be a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
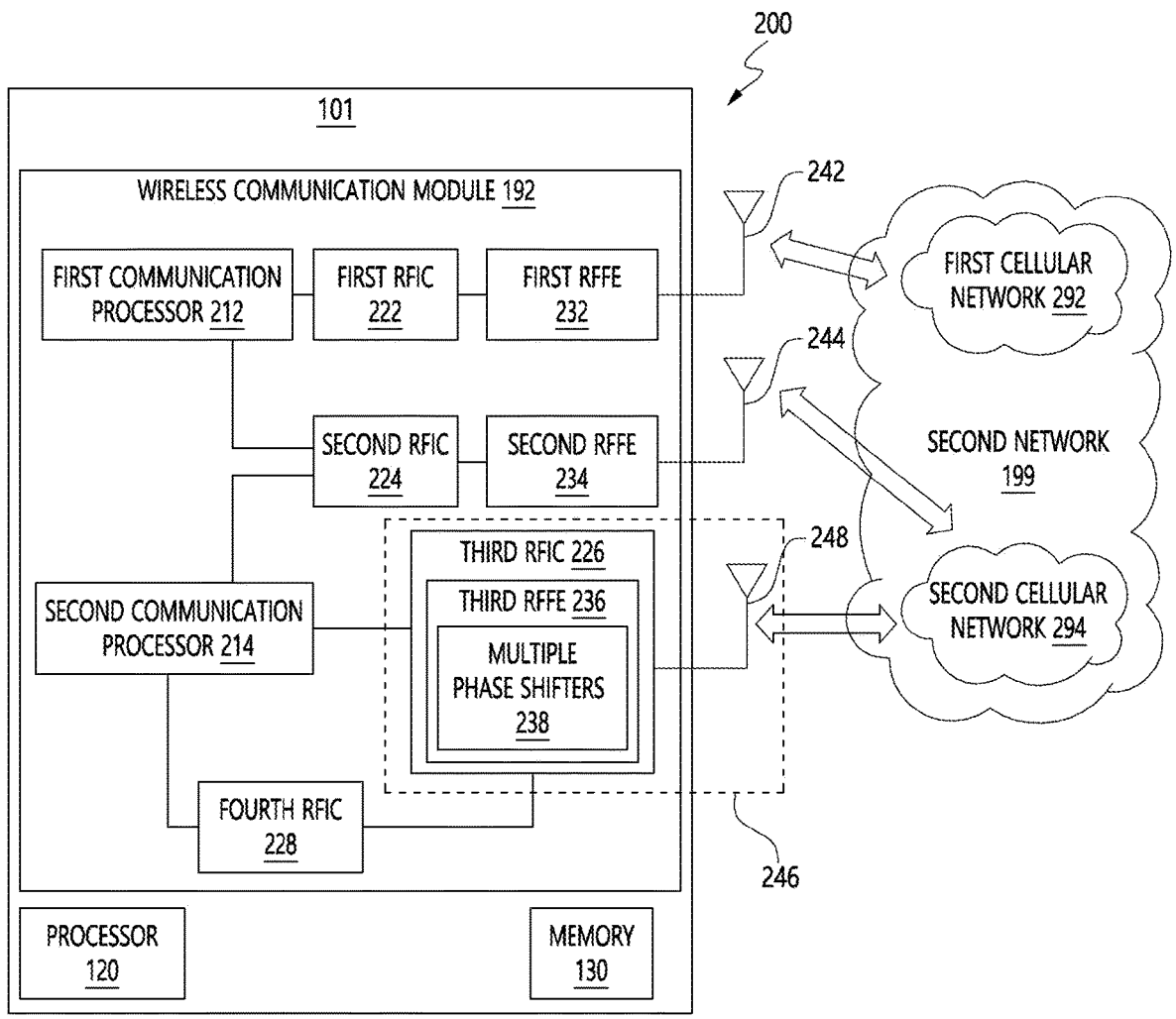
FIG. 2 is a block diagram of an electronic device for supporting legacy network communication and 5G network communication according to various embodiments.

FIG. 2 is a block diagram 200 of an electronic device 101 for supporting legacy network communication and 5G network communication according to an embodiment.

Referring to FIG. 2, the electronic device 101 may further include a first communication processor 212, a second communication processor 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include a processor 120 and a memory 130. A second network 199 may include a first network 292 and a second network 294. The electronic device 101 may further include at least one of the components shown in FIG. 1, and the second network 199 may further include at least another network. According to an embodiment, the first communication processor 212, the second communication processor 214, the first RFIC 222, the second RFIC 224, the fourth RFIC 228, the first RFFE 232, and the second RFFE 234 may constitute at least a part of the wireless communication module 192. According another embodiment, the fourth RFIC 228 may be omitted, or may be included as a part of the third RFIC 226.

The first communication processor 212 may establish a communication channel in a band to be used for wireless communication with the first network 292, and may support legacy network communication through the established communication channel. According to certain embodiments, the first network 292 may be a legacy network including second generation (2G), third generation (3G), fourth generation (4G), or long-term evolution (LTE) network. The second communication processor 214 may establish a communication channel corresponding to a designated band (e.g., from about 6 GHz to about 60 GHz) to be used for wireless communication with a second network 294, and may support 5G network communication through the established communication channel. According to certain embodiments, the second network 294 may be 5G network defined in the third generation partnership project (3GPP). Additionally, according to an embodiment, the first communication processor 212 or the second communication processor 214 may establish a communication channel corresponding to another designated band (e.g., about 6 GHz or less) to be used for wireless communication with the second network 294, and may support 5G network communication through the established communication channel. According to an embodiment, the first communication processor 212 and the second communication processor 214 may be implemented in a single chip or a single package. According to certain embodiments, the first communication processor 212 or the second communication processor 214 may be formed in a single chip or a single package together with the processor 120, the auxiliary processor 123, or the communication module 190 of FIG. 1.

At the time of signal transmission, the first RFIC 222 may convert a baseband signal generated by the first communication processor 212 into a radio-frequency (RF) signal of about 700 megahertz (MHz) to about 3 GHz used for the first network 292 (e.g., a legacy network). At the time of signal reception, the RF signal may be acquired from the first network 292 (e.g., legacy network) through an antenna (e.g., the first antenna module 242), and may be preprocessed through RFFE (e.g., the first RFFE 232). The first RFIC 222 may convert the preprocessed RF signal into a baseband signal which can be processed by the first communication processor 212.

At the time of signal transmission, the second RFIC 224 may convert a baseband signal generated by the first communication processor 212 or the second communication processor 214 into an RF signal (hereinafter, 5G Sub6 RF signal) of Sub6 band (e.g., about 6 GHz or less) used for the second network 294 (e.g., a 5G network). At the time of signal reception, the 5G Sub6 RF signal may be acquired from the second network 294 (e.g., 5G network) through an antenna (e.g., the second antenna module 244), and may be preprocessed through RFFE (e.g., the second RFFE 234). The second RFIC 224 may convert the preprocessed 5G Sub6 RF signal into a baseband signal which can be processed by a corresponding communication processor among the first communication processor 212 and the second communication processor 214.

The third RFIC 226 may convert a baseband signal generated by the second communication processor 214 into an RF signal (hereinafter, 5G Above6 RF signal) of 5G Above6 band (e.g., from about 6 GHz to about 60 GHz) to be used in the second network 294 (e.g., 5G network). At the time of signal reception, the 5G Above6 RF signal may be acquired from the second network 294 (e.g., 5G network) through an antenna (e.g., the antenna 248), and may be preprocessed through the third RFFE 236. For instance, the third RFEE(236) may preprocess the signal using the phase converter ($38). the third RFIC 226 may convert the preprocessed 5G Above6 RF signal into a baseband signal that can be processed by the second communication processor 214. According to an embodiment, the third RFFE 236 may be configured as a part of the third RFIC 226.

According to an embodiment, the electronic device 101 may include the fourth RFIC 228 separately from the third RFIC 226 or as at least a part thereof. In this instance, the fourth RFIC 228 may convert a baseband signal generated by the second communication processor 214 into an RF signal (hereinafter, intermediate frequency (IF) signal) of an intermediate frequency band (e.g., from about 9 GHz to about 11 GHz) and may then transmit the IF signal to the third RFIC 226. The third RFIC 226 may convert the IF signal into a 5G Above6 RF signal. At the time of signal reception, the 5G Above6 RF signal may be received from the second network 294 (e.g., 5G network) through an antenna (e.g., the antenna 248) and may be converted into an IF signal by the third RFIC 226. The fourth RFIC 228 may convert the IF signal into a baseband signal that can be processed by the second communication processor 214.

According to an embodiment, the first RFIC 222 and second RFIC 224 may be implemented as at least a part of a single package or a single chip. According to an embodiment, the first RFFE 232 and the second RFFE 234 may be implemented as at least a part of a single package or a single chip. According to an embodiment, at least one antenna module of the first antenna module 242 or the second antenna module 244 may be omitted, or may be combined with the other antenna module to process RF signals of multiple bands corresponding thereto.

According to an embodiment, the third RFIC 226 and antenna 248 may be arranged on the same substrate to constitute a third antenna module 246. For example, the wireless communication module 192 or the processor 120 may be arranged on a first substrate (e.g., a main PCB). In this instance, the third antenna module 246 may be configured by arranging the third RFIC 226 in a partial area (e.g., lower surface) of a second substrate (e.g., sub PCB) independent of the first substrate and arranging the antenna 248 in another partial area (e.g., upper surface) thereof. According to an embodiment, the antenna 249 may include an antenna array capable of be used for, for example, beamforming. Arranging the third RFIC 226 and the antenna 248 on the same substrate can reduce the length of a transmission line therebetween. For example, it may reduce the loss (e.g., attenuation) of a signal in a high-frequency band (e.g., about 6GH-about 60 GHz), used for 5G network communication, by a transmission line. Therefore, the electronic device 101 may exhibit an enhanced quality or speed of communication with the second network 294 (e.g., a 5G network).

The second network 294 (e.g., a 5G network) may be operated independently of the first network 292 (e.g., a legacy network) (e.g., stand-alone (SA)) or may be operated while being connected to the first network (e.g., non-stand-alone (NSA)). For example, the 5G network may include only an access network (e.g., 5G radio access network (RAN) or next-generation RAN (NG RAN)) and may not include a core network (e.g., next-generation core (NGC)). In this instance, the electronic device 101 may access an access network of a 5G network and may then access an external network (e.g., Internet) under the control of a core network (e.g., evolved packed core (EPC) network) of a legacy network. Protocol information (e.g., LTE protocol information) for communication with the legacy network or protocol information (e.g., new radio (NR) protocol information) for communication with the 5G network are stored in a memory 230, and may be accessed by another component (e.g., the processor 120, the first communication processor 212, or the second communication processor 214).

Figure 3:
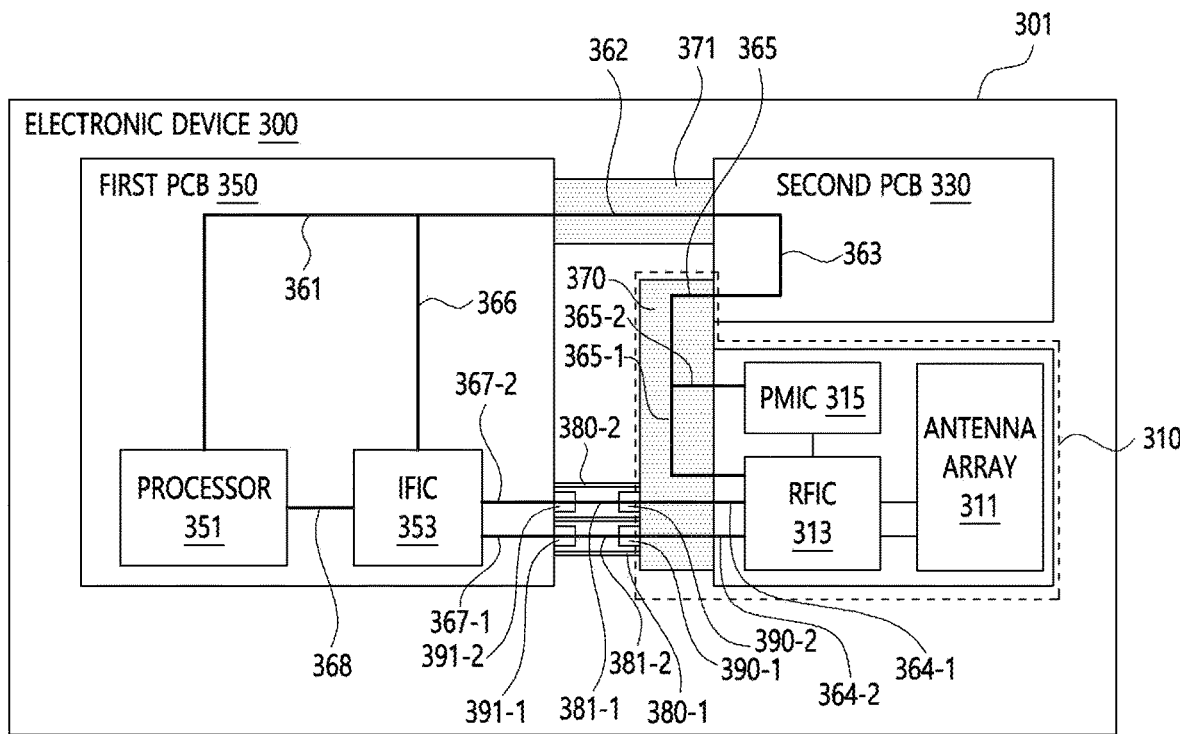
FIG. 3 is a schematic circuit diagram of an electronic device for supporting high-frequency communication according to an embodiment.

FIG. 3 is a schematic circuit diagram of an electronic device for supporting high-frequency communication according to an embodiment. In the present disclosure, high-frequency communication may refer to communication in mmWave band, for example, communication in the frequency band (e.g., 28 GHz, 39 GHz, etc.) of Frequency Range 2 (e.g., 24.25-52.6 GHz) defined in 3GPP.

Referring now to FIG. 3, the electronic device 300 (e.g., electronic device 101 of FIG. 1) may include a housing 301; an antenna module 310 (e.g., antenna module 197 of FIG. 1, or the first antenna module 242, second antenna module 244, and third antenna module 248 of FIG. 2) including an antenna array 311 facing and spaced apart from one side of the housing 301, a radio frequency integrated circuit (RFIC) 313 and a first flexible printed circuit board 370; a first printed circuit board 350 including a processor 351 (e.g., processor 120 of FIG. 1, or the first communication processor 212 and second communication processor 214 of FIG. 2), an intermediate frequency integrated circuit (IFIC) 353 and a first transmission line 361 extending from the processor 351; a second flexible printed circuit board 371 including a second transmission line 362 electrically connected to the first transmission line 361; a second printed circuit board 330 including a third transmission line 363 electrically connected to the second transmission line 362; a fourth transmission line 364 (364-1 and 364-2) extending from the RFIC 313; a fifth transmission line 365 (365-1 and 365-2) extending from the RFIC 313 and electrically connected to the third transmission line 363; a first connector 390 (390-1 and 390-2) electrically connected to the fourth transmission line 364-1 and 364-2 and formed on one surface of the first flexible printed circuit board 370; and a coaxial cable 380 (380-1 and 380-2) electrically connecting the first connector 390 (390-1 and 390-2) and the IFIC 353. The processor 351 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed under the provisions of 35 U.S.C. 112(f), unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

According to an embodiment, the antenna module 310 may be configured to transmit or receive signals to/from the outside of the device (e.g., an external electronic device). The antenna module 310 may be disposed adjacent to the housing 301 to transmit or receive signals to/from an external electronic device. The antenna module 310 may be of a mmWave antenna module. The antenna module 310 may include the antenna array 311 (e.g., antenna 248 of FIG. 2), the RFIC 313 (e.g., first RFIC 222, second RFIC 224 and third RFIC 226 of FIG. 2), and a power management integrated circuit (PMIC) 315 (e.g., power management module 188 of FIG. 1). According to an embodiment, the antenna array 311 may be disposed on one surface of a substrate forming the antenna module 310, and the RFIC 313 may be disposed on the other surface of the substrate.

According to an embodiment, the antenna module 310 may include the RFIC 313 and the antenna array 311 disposed on the same substrate. This way, the antenna module 310 can reduce the transmission path of signals transmitted to the antenna module and signals received from the antenna module, thereby reducing signal loss in the transmission line of the signals in RF frequency band (hereinafter, referred to as RF signals). The high frequency signal (or RF signal) may be signals in a frequency band used for 5G network communication, and may refer to signals in a high frequency band (e.g., about 6 GHz to about 60 GHz).

Signal loss may generally refer to signal loss in the transmission line, for example, in a connector and/or a transmission line on a data transmission path. In other words, signal attenuation occurring in the transmission line (e.g., owing to conductor loss, or dielectric loss) or caused by the influence of external signals (e.g. high frequency signals) incident on the transmission line causing interference, signal distortion, or the like.

According to an embodiment, the antenna radiators of the antenna array 311 may include a substrate and conductive patterns formed on the substrate. The antenna array 311 may include a plurality of antennas having the same shape or different shapes. For example, the conductive patterns printed on the substrate may form a patch antenna and/or a dipole antenna. The antenna array 311 may include a plurality of patch antennas and/or dipole antennas arranged in an iterative manner. The antenna array 311 may form a mmWave antenna radiator. The antenna array 311 may be used for beamforming. For example, the antenna array 311 may be a set of antenna radiators. The antenna array 311 may synthesize beam patterns of the antenna radiators to form a directional beam pattern.

The mmWave signal transmitted to the outside by the antenna array 311 is capable of large-capacity transmission. Due to low diffraction, the mmWave signal may be blocked or reflected by an external object. The electronic device 300 may be configured to transmit the transmission signal to the antenna array 311 with minimum loss of the transmission signal within the electronic device 300, in order to compensate for the transmission characteristics of the mmWave signal. For example, the electronic device 300 may substitute a part of the transmission line for transmitting the mmWave signal with coaxial cables 380 (380-1 and 380-2), dispose a connector adjacent to the antenna module 310, and include a member protruding from the housing to support the coaxial cables 380 (380-1 and 380-2) and fix the connectors, thereby reducing signal loss.

According to an embodiment, the RFIC 313 may be disposed on a surface distinct from the surface of the substrate on which the antenna array 311 is disposed. The RFIC 313 may include a mixer for up-conversion or down-conversion of signals. The RFIC 313 may up-convert an intermediate frequency (IF) signal received from the IFIC 353 (e.g., fourth RFIC 228 of FIG. 2) into a radio frequency (RF) signal. The RF signal up-converted via the RFIC 313 may be transmitted to the antenna array 311. When receiving signals, the RFIC 313 may down-convert the RF signal obtained through the antenna array 311 into an IF signal. The RFIC 313 may transmit the converted IF signal to the IFIC 353.

The intermediate frequency (IF) signal may be a signal in the intermediate frequency band (e.g., about 9 GHz to about 11 GHz), and it may be converted by the IFIC from a baseband signal generated by a processor (e.g., processor 120 of FIG. 1, or first communication processor 212 or second communication processor 214 of FIG. 2).

According to an embodiment, the PMIC 315 may be disposed on a surface distinct from the surface of the substrate on which the antenna array 311 is disposed. For example, the PMIC 315 and the RFIC 313 may be disposed on a surface different from the surface of the substrate on which the antenna array 311 is disposed. The PMIC 315 may be supplied electric power from the first printed circuit board 350 or a main printed circuit board distinct from the first printed circuit board. The PMIC 315 may use the power to supply necessary power to various components on the antenna module 310.

According to an embodiment, the first printed circuit board 350 may include a processor 351 for supporting 4G network communication and/or 5G network communication. The first printed circuit board 350 may be a printed circuit board distinct from the substrate of the antenna module 310. The first printed circuit board 350 may transmit signals to control the antenna module 310 and/or baseband signals to be transmitted to the antenna. These signals may be transmitted to the RFIC 313 for network communication. According to an embodiment, the first printed circuit board 350 may receive power from a power supply, and may transfer at least a portion of the received power to the antenna module 310.

According to one embodiment, the processor 351 may be a communication processor. The processor 351 may establish a communication channel in a band for wireless communication with an external network. According to an embodiment, the processor 351 may generate a baseband signal. To transmit a signal, the processor 351 may provide the baseband signal to the IFIC 353. According to an embodiment, to receive a signal, the processor 351 may receive a down-converted baseband signal from the IFIC 353 or the RFIC 313. The processor 351 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed under the provisions of 35 U.S.C. § 112(f), unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

According to an embodiment, the IFIC 353 may include a mixer for up-conversion or down-conversion of signals. For example, when transmitting a signal, the IFIC 353 may up-convert the baseband signal received from the processor 351 into an intermediate frequency (IF) signal. The IFIC 353 may transmit the up-converted IF signal to the RFIC 313. As another example, when receiving a signal, the IFIC 353 may down-convert an IF signal received from the RFIC 313 into a baseband signal for processing in the processor 351. The IFIC 353 may transmit the down-converted baseband signal to the processor 351.

The electronic device 300 may include transmission lines for transmitting signals. The transmission lines may be used to transmit signals for transmission via the antenna, control signals, electric power, and so on.

According to an embodiment, the processor 351 may transmit control signals to the antenna module 310 via the first transmission line 361, the second transmission line 362, the third transmission line 363, the fifth transmission line 365-1, and/or another fifth transmission line 365-2. The processor 351 may transmit control signals to the IFIC 353 via the first transmission line 361 and/or the sixth transmission line 366. The processor 351 may be configured to transmit or receive transmission signals to/from the antenna module 310, via the fourth transmission line 364 (e.g., 364-1 and 364-2), a seventh transmission line 367 (e.g., 367-1 and 367-2) of the coaxial cable 380 (e.g., 380-1 and 380-2) and/or an eighth transmission line 368.

According to an embodiment, the first printed circuit board 350 may include a transmission line capable of transmitting transmission signals (e.g., baseband signals) provided by the processor 351, or control signals from the PMIC 315 and/or the RFIC 313. For example, the first printed circuit board 350 may include the first transmission line 361, the sixth transmission line 366, the seventh transmission line 367 (e.g., 367-1 and 367-2) and/or the eighth transmission line 368.

According to an embodiment, the first transmission line 361 may extend from the processor 351. The first transmission line 361 may be a line printed on a surface of one of the layers of the first printed circuit board 350. The first transmission line 361 may be electrically connected to a connector (not shown) for the second flexible printed circuit board 371 formed on the first printed circuit board 350. The first transmission line 361 may electrically connect the processor 351 and the second flexible printed circuit board 371. Control signals generated by the processor 351 may be transmitted to the antenna module 310 through a signal path formed with the first transmission line 361, the second flexible printed circuit board 371, the second printed circuit board 330, and/or the first flexible printed circuit board 370.

According to one embodiment, the sixth transmission line 366 may extend from the IFIC (353). The sixth transmission line 366 may be electrically connected to the first transmission line 361. The first transmission line 361 and/or the sixth transmission line 366 may electrically connect the processor 351 and the IFIC 353. According to an embodiment, the sixth transmission line 366 may be directly connected to the processor 351 without intervention of the first transmission line 361. The sixth transmission line 366 may electrically connect the processor 351 and the IFIC 353. The sixth transmission line 366 may be used to transmit control signals from the processor 351 to the IFIC 353. The sixth transmission line 366 may be printed on one layer of the first printed circuit board 350.

According to an embodiment, the seventh transmission lines 367 (367-1 and 367-2) may include a plurality of antenna signal lines. The seventh transmission lines 367 (367-1 and 367-2) may be electrically connected to the third connectors 391 (e.g., 391-1 and 391-2) formed on one surface of the first printed circuit board 350. According to one embodiment, the seventh transmission line 367-1 of the seventh transmission lines 367 (367-1 and 367-2) may carry IF signals having horizontal polarized wave through one connector 391-1 of the third connectors 391 of the coaxial cable and/or the coaxial cable line 381-2. The coaxial cable lines 381-1 and 381-2 may be signal lines incorporated in the coaxial cables 380. According to an exemplary embodiment, the seventh transmission line 367-2 of the seventh transmission lines 367 (367-1 and 367-2) may carry IF signals having vertical polarized wave through the other one 391-2 of the third connectors of the coaxial cable and/or the coaxial cable line 381-1. According to an example, the seventh transmission lines 367 (367-1 and 367-2) may be printed on one layer of the first printed circuit board 350.

The IF signals, which is RF signals transmitted to the antenna module 310 through the seventh transmission line 367 (367-1 and 367-2), are transmitted through the coaxial cable 380 (380-1 and 380-2) to the RFIC 313, and therefore, the electronic device 300 can reduce or minimize signal attenuation in the IF signals. For example, the attenuation ratio per unit length of the IF signals transmitted to the antenna module 310 may be about 0.76 dB/mm in the signal line on a printed circuit board (e.g., the seventh transmission line 367 (367-1 and 367-2), approximately 0.47 dB/mm in the signal line on a flexible printed circuit board (e.g., the fourth transmission line 364 (364-1 and 364-2), and then, approximately 0.16 dB/mm in the coaxial cable 380 (i.e., 380-1 and 380-2). According to an embodiment, the electronic device 300 may configure a part of the transmission path of the IF signal with the coaxial cable 380 (380-1 and 380-2) having the lowest attenuation ratio per unit length, so that it can reduce or minimize the loss in the intermediate frequency signal.

According to one embodiment, the coaxial cable connectors 391 (391-1 and 391-2) may be disposed adjacent to the IFIC 353 to reduce the length of the seventh transmission lines 367 (367-1 and 367-2) on the printed circuit board, thereby decreasing the loss in the transmission signal transferred via the seventh transmission lines 367 (367-1 and 367-2) from the IFIC 353.

According to an embodiment, in order to reduce the transmission signal loss, the first printed circuit board 350 may utilize the antenna module 310 and the coaxial cables 380 (380-1 and 380-2). The coaxial cable 380 (380-1 and 380-2) may include the coaxial cable lines 381-1 and 381-2, and a conductive material (not shown) surrounding the coaxial cable lines 381-1 and 380-2 may be used to reduce the signal loss. For example, the coaxial cable 380 (380-1 and 380-2) may include dielectric (not shown) with high dielectric constant, surrounding each of the coaxial cable lines 381-1 and 381-2 made of a conductive material (e.g., copper), and/or a conductive material surrounding the dielectric. The coaxial cables 380 (380-1 and 380-2) may have a structure where the signal transmission line, the dielectric, and the conductive material are coaxially disposed.

According to an embodiment, the IF signal up-converted through the IFIC 353 may be in a higher frequency band than the baseband signal generated by the processor 351. For transmission, the IF signal may be subject to greater signal loss than the baseband signal. When transmitting the up-converted IF signal to the antenna module 310 through the IFIC 353, the coaxial cable 380 (380-1 and 380-2) can reduce signal loss by preventing electrical interference. This is accomplished by shielding by the conductive material surrounding the outer surface of the coaxial cable 380.

According to an embodiment, the eighth transmission line 368 may extend from the processor 351 to the IFIC 353. The eighth transmission line 368 may carry baseband transmission signals. For example, when transmitting signals, the processor 351 may generate a baseband signal and then transmit the generated baseband signal to the IFIC 353 through the eighth transmission line 368. The IFIC 353 may up-convert the baseband signal received from the processor 351 into an intermediate frequency (IF) signal. The IFIC 353 may transmit the up-converted IF signal to the RFIC 313 through the seventh transmission line 367 (367-1 and 367-2) and/or the coaxial cable 380 (380-1 and 380-2). Conversely in another example, when receiving signals, the IFIC 353 may receive the IF signal from the RFIC 313, through the fourth transmission line 364 (364-1 and 364-2), the coaxial cable 380 (380-1 and 380-2) and the seventh transmission line 367 (367-1 and 367-2). The IFIC 353 may down-convert the received IF signal to a baseband signal. The IFIC 353 may transmit the down-converted baseband signal to the processor 351 through the eighth transmission line 368.

According to an embodiment, the second flexible printed circuit board 371 may include the second transmission line 362. The second transmission line 362 may be electrically connected to the first transmission line 361 to supply control signals or power provided from the first printed circuit board 350. The second transmission line 362 may be electrically connected to the third transmission line 363 to carry the provided control signals or power to the second printed circuit board 330.

According to an embodiment, the second printed circuit board 330 may include a connector and/or a signal transmission line for supplying control signals, power, and a ground signal to the antenna module 310. The second printed circuit board 330 may include a third transmission line 363 for providing control signals and/or power to the antenna module 310, and a connector electrically connected to the third transmission line 363. The third transmission line 363 may be electrically connected to the second transmission line 362. The third transmission line 363 may deliver control signals or power received from the second flexible printed circuit board 371 to the antenna module 310. The second printed circuit board 330 may separately include a transmission line and/or a connector for electrical connection between the antenna module 310 and a ground point provided in the electronic device 300.

According to an embodiment, the first flexible printed circuit board 370 may include transmission lines that may transmit signals supplied from the antenna module 310 to the second printed circuit board 330 and/or the first printed circuit board 350. For example, the first flexible printed circuit board 370 may include the fourth transmission line 364 (e.g., 364-1 and 364-2), and the fifth transmission line 365-1, and/or another fifth transmission line 365-2. The fourth transmission line 364 (e.g., 364-1 and 364-2) electrically connected to the RFIC 313. The first flexible printed circuit board 370 may include the first connector 390 (e.g., 390-1 and 390-2) for electrical connection in between the fourth transmission line 364 (364-1 and 364-2) and the coaxial cable 380 (380-1 and 380-2). The first connector 390 (390-1 and 390-2) may be configured to receive transmission signals from the fourth transmission line 364 (364-1 and 364-2) or transmit the transmission signal to the fourth transmission line 364 (364-1 and 364-2).

According to one embodiment, a part of the fourth transmission line 364 (364-1 and 364-2) may extend from the RFIC 313 along one side of the substrate forming the antenna module 310 to an edge of the substrate. The remaining part of the fourth transmission line 364 (364-1 and 364-2) may extend from the part of the fourth transmission line 364 (364-1 and 364-2) located at the edge along one layer of the flexible printed circuit board 370 to the first connector 390 (390-1 and 390-2).

According to an embodiment, the fourth transmission line 364 may include a plurality of transmission lines. The fourth transmission line 364 may include a fourth transmission line 364-1 and another fourth transmission line 364-2. A plurality of coaxial cables 380 (380-1 and 380-2) and coaxial cable lines 381 (381-1 and 381-2) may be respectively connected to the fourth transmission line 364. For example, the coaxial cable line 381 (381-1 and 381-2) may include a first coaxial cable line 381-1, which is a signal transmission line, and a second coaxial cable line 381-2, which is another signal transmission line. The coaxial cable 380 may include a first coaxial cable 380-1 incorporating the first coaxial cable line 381-1, and a second coaxial cable 380-2 incorporating the second coaxial cable line 381-2. The fourth transmission line 364-1 may carry intermediate frequency transmission signals corresponding to horizontal polarization wave. For example, when transmitting signals, the fourth transmission line 364-1 may transmit IF signals having horizontal polarization wave up-converted from the IFIC 353 through the first coaxial cable 380-1 to the RFIC 313. According to an embodiment, the fourth transmission line 364-2 may carry IF signals corresponding to vertical polarization wave. The other fourth transmission line 364-2 may transmit IF signals corresponding to the vertical polarization wave from the IFIC 353 through the second coaxial cable 380-2 to the RFIC 313.

When receiving signals, the fourth transmission line 364-1 may deliver IF signals corresponding to the down-converted horizontal polarization received from the RFIC 313 through the second coaxial cable 380-2 to the IFIC 353. Similarly when receiving signals, the fourth transmission line 364-2 may deliver IF signals corresponding to the down-converted vertical polarization from the RFIC 313 through the second coaxial cable 380-2 to the IFIC 353.

According to an embodiment, the first connectors 390 (390-1 and 390-2) may be disposed on the first flexible printed circuit board 370 to deliver transmission signals received from the RFIC 313 to the coaxial cables 380 (380-1 and 380-2), thereby reducing signal loss. Signals transmitted through the fourth transmission lines 364 (364-1 and 364-2) may be RF signals in approximately 9 GHz to 11 Hz of the intermediate frequency band, and possible loss of the signal may occur in signal transmission. Accordingly, in order to reduce such signal loss, the first connectors 390 (390-1 and 390-2) may require to be disposed closely adjacent to the antenna module 310 and to reduce additional connectors.

Unlike the shown arrangement in which the first connector 390 (390-1 and 390-2) is formed on the first flexible printed circuit board 370, when the first connector 390 (390-1 and 390-2) is disposed on the second printed circuit board 330, signal loss may be caused by connectors connecting the first flexible printed circuit board 370 and the second printed circuit board 330. Since the signals to be transmitted to the antenna module has to go through the signal line formed on the second printed circuit board 330, the travelling distance of the signals to be transmitted to the antenna module may increase, which may lead to additional signal loss.

According to one embodiment, the first flexible printed circuit board 370 may include at least part of a fifth transmission line 365 extending from the second printed circuit board 330, and the fifth transmission line may include a fifth transmission line 365-1 extending to the RFIC 313 and/or another fifth transmission line 365-2 extending to the PMIC 315. The fifth transmission lines 365-1 and/or 365-2 may be electrically connected to the second printed circuit board 330, and control signals delivered through the second printed circuit board 330 may be transmitted to the PMIC 315 and/or the RFIC 313.

The fifth transmission line 365-1 and the other fifth transmission line 365-2 of the first flexible printed circuit board 370 may be distinct from each other. For example, the fifth transmission line 365-1 may create a first path of an MIPI line, and the other fifth transmission line 365-2 may create a second path distinct from the first path in the MIPI line. For example, the fifth transmission line 365-1 may establish a first path while electrically disconnected from the other fifth transmission line 365-2, while the fifth transmission line 365-2 may establish a second path while electrically disconnected from the other fifth transmission line 365-1. According to an embodiment, the second transmission line 362 and/or the third transmission line 363 electrically connected to the fifth transmission line 365 are illustrated as a single path, but their paths are not limited thereto and they may include multiple paths that are mutually electrically disconnected.

According to an embodiment, a part of the fifth transmission line 365-1 may be configured to extend from the RFIC 313, along one surface of the substrate forming the antenna module 310, to one of the edges of the substrate. The remaining part of the fifth transmission line 365-1 may be configured to extend from the part of the fifth transmission line 365-1 located at the one edge, along one layer of the first flexible printed circuit board 370, to the second printed circuit board 330.

According to an embodiment, a part of the fifth transmission line 365-2 may be configured to extend from the PMIC 315, along one surface of the substrate forming the antenna module 310, to one of the edges of the substrate. The remaining part of the fifth transmission line 365-2 may be configured to extend from the part of the fifth transmission line 365-2 located at the one edge, along one layer of the first flexible printed circuit board 370, to the second printed circuit board 330 for electrical connection to the second printed circuit board. For example, the fifth transmission line 365-2 may be extended from one edge of the substrate, along the second path distinct from the first path of the fifth transmission line 365-1, to the second printed circuit board 330 for electrical connection to the second printed circuit board 330. In another example, the fifth transmission line 365 may be electrically connected to the first printed circuit board 350 through the second transmission line 362 and the third transmission line 363. Although the second transmission line 362 and the third transmission line 363 are illustrated as one path, they are not limited thereto and may include a plurality of electrically disconnected paths. Specifically, the second transmission line 362 and/or the third transmission line 363 may include one line connected to the first path of the fifth transmission line 365-1, or may include another line connected to the second path of the fifth transmission line 365-2.

As described above, the first flexible printed circuit board 370 according to an embodiment may be integrated with the antenna module 310 such that there are no connectors between the first flexible printed circuit board 370 and the antenna module 310. Since the flexible printed circuit board 370 integrated with the antenna module 310 requires no connector for coupling, it is possible to reduce loss in signals transmitted to the antenna module due to impedance mismatch. Alternatively, according to an embodiment, the first flexible printed circuit board 370 may be manufactured separately from the substrate of the antenna module 310 and may be connected to the antenna module 401 via a connector (not shown).

The antenna module 310 may include a first connector 390 (390-1 and 390-2) formed on the first flexible printed circuit board 370. When the connector for the coaxial cable 380 (380-1 and 380-2) is formed on the second printed circuit board 330, signals including information to be transmitted to an external electronic device via the antenna may pass through the connector connecting the second printed circuit board 330 and the first flexible printed circuit board 370. According to an embodiment, the transmission line of signals received from the external electronic device does not pass through the first flexible printed circuit board 370, the second printed circuit board 330, the connector connecting the second printed circuit board 330 and the first flexible printed circuit board the 370, so the connection can be directly established via the connector formed on the first flexible printed circuit board 370, thereby reducing the signal loss.

According to an embodiment, the electronic device 300 may be configured in such a manner that the coaxial cable 380 (380-1 and 380-2) is directly connected to the first flexible printed circuit board 370 of the antenna module, so the length of a feeding line formed on the printed circuit board for connection to the antenna array 311 of the antenna module 310 can be significantly reduced, thereby reducing the signal loss.

Figure 4:
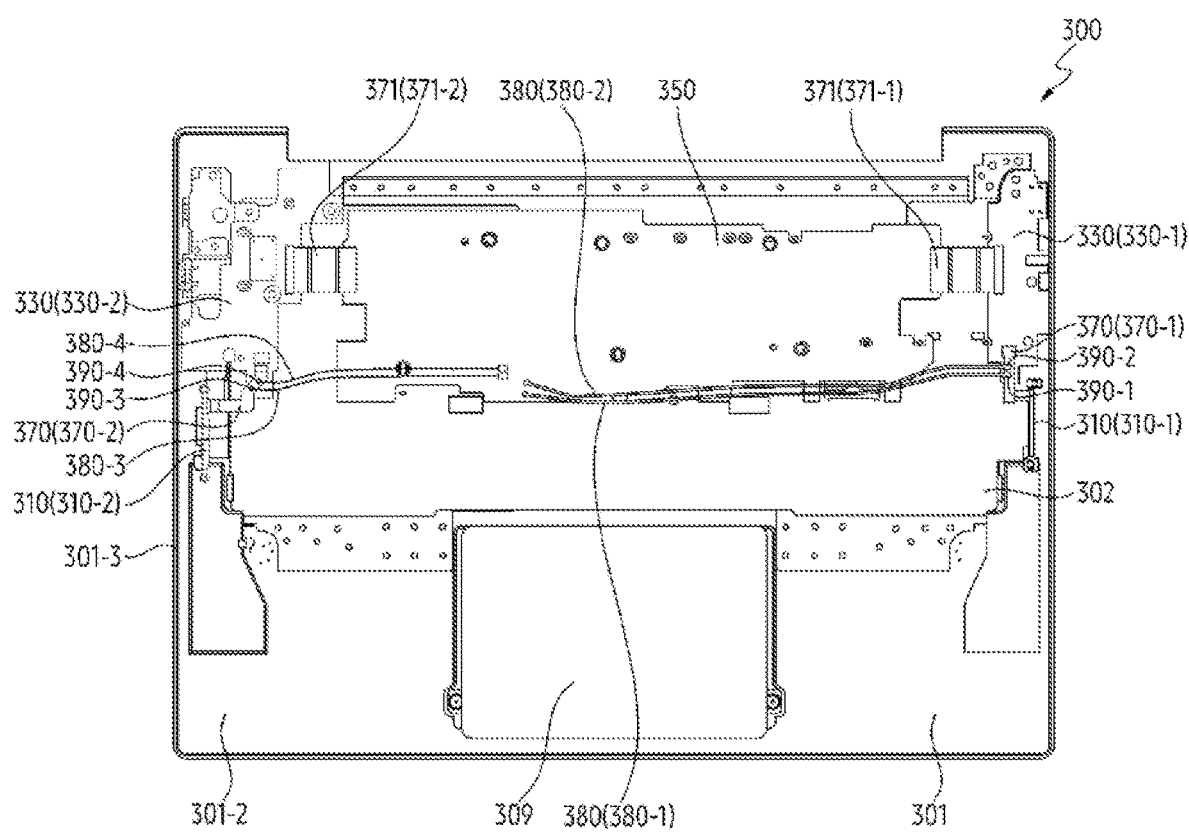
FIG. 4 is a plan view illustrating an internal arrangement of an electronic device according to an embodiment.

FIG. 4 is a plan view illustrating an internal arrangement of an electronic device according to an embodiment.

Referring to FIG. 4, the electronic device 300 may include a housing 301, a bracket 302, a first printed circuit board 350, a second printed circuit board 330, an antenna module 310, and a first flexible printed circuit board 370, a second flexible printed circuit board 371, and a coaxial cable 380 (380-1 and 380-2).

According to an embodiment, the housing 301 may include a first surface (not shown in FIG. 4) (e.g., surface 301-1 facing second surface 301-2 of FIG. 6A), a second surface 301-2, and a third surface 301-3 (e.g., the side surface of the electronic device 300). The third surface 301-3 may be disposed along the periphery of the first surface and the second surface 301-2 to form an internal space distinguished from the exterior of the electronic device 300. The housing 301 may be the structure to form the exterior of the electronic device 300. According to another embodiment, the housing 301 may further include an inner case of the electronic device 300.

According to an embodiment, the housing 301 may be made of a rigid material. The housing 301 may be configured to accommodate various components of the electronic device 300 disposed in the internal space. The first surface 301-1 of the housing 301 may include a display (not shown). For example, when the electronic device 300 is a tablet personal computer (PC) or smartphone, the display may be disposed on at least a portion of either the first surface 301-1 or the second surface 301-2 of the housing 301, or form at least a portion of the first surface 301-1 or the second surface 301-2. In another example, when the electronic device 300 is a notebook computer, a keypad (not shown) and/or a touchpad (not shown) may be arranged on top of the second surface 301-2.

According to an embodiment, the third surface 301-3 may form the side surface of the electronic device 300. The third surface 301-3 may be integrated with the second surface 301-2 of the electronic device 300.

According to an embodiment, the second surface 301-2 may include an opening 309 formed to expose a touch pad, and/or a plurality of openings (not shown) formed to expose the keypad. The touchpad and/or the keypad may be arranged such that at least a portion of the key pad and/or the touchpad and keypad is exposed through the opening so as to be operable by the user. However, the arrangement is not limited thereto. For example, the electronic device 300 may be a tablet PC, and/or the electronic device 300 may not include such an opening 309.

According to an embodiment, the bracket 302 may be disposed inside the electronic device 300 and supported by the second surface 301-2 of the housing 301. The bracket 302 may be made of a conductive material. The bracket 302 may be a metal plate and may occupy a part of the second surface 301-2. The bracket 302 may be configured to support various components accommodated within the electronic device 300. The bracket 302 may be referred to an inner case of the electronic device. For example, the bracket 302 may be configured to partition an internal space of the electronic device 300.

According to an embodiment, the bracket 302 may include a rigid material and support the printed circuit boards 330 and 350. The bracket 302 may be physically fastened to the printed circuit boards 330 and 350 by a fixing member. The bracket 302 may be made of a conductive material, and may function as the ground or a heat dissipating member for transmitting heat generated from the printed circuit boards 330 and 350 and radiating it to the outside of the device. For example, the bracket 302 may be connected to the first printed circuit board 350 and/or the second printed circuit board 330 via a heat transfer member made of a conductive material. In another example, the bracket 302 may be electrically connected to the ground of the first printed circuit board 350 and/or the second printed circuit board 330 to provide the ground to the first printed circuit board 350 and/or the second printed circuit board 330.

According to an embodiment, the first printed circuit board 350 may be disposed on and supported by at least a partial area of the bracket 302. The first printed circuit board 350 may include thereon a processor 351 (e.g., processor 120 of FIG. 1, first communication processor 212 of FIG. 2, second communication processor 214 of FIG. 2, and/or a processor of FIG. 3), an IFIC (e.g., IFIC 353 of FIG. 3), a memory and/or an interface. In order to dissipate heat generated by the processor and/or the IFIC (e.g., the IFIC 353 of FIG. 3) disposed on the first printed circuit board 350, the electronic device 300 may include a heat transfer member for thermally connecting the bracket 302 and at least one of the processor and the IFIC.

According to an embodiment, the second printed circuit board 330 may be supported by the bracket 302. The second printed circuit board 330 may be disposed in the inner space, and at least a part of the second printed circuit board 330 may be disposed to overlap the bracket 302. The second printed circuit board 330 may be disposed adjacent to the antenna module. The second printed circuit board 330 may include a connector corresponding to the first flexible printed circuit board 370, for connecting the antenna module 310 and the first flexible printed circuit board 370. The second printed circuit board 330 may supply power to the antenna module 310 and provide signals for controlling circuitry (e.g., the PMIC 315, the RFIC 313, etc.) included in the antenna module 310. The second printed circuit board 330 may be connected to a ground signal line of the antenna module 310 to provide the ground to the antenna module 310.

According to an embodiment, the antenna module 310 may be disposed adjacent to the third surface 301-3 (e.g., side surface) while being supported onto the second surface 301-2, in order to increase communication performance with external networks. When the antenna module 310 is disposed adjacent to the third surface 301-3, it is possible to reduce the influence of the conductive material included in the internal components of the electronic device 300. In order to obtain the directionality of patterns radiated from the antenna module 310, the antenna module 310 may be formed so that the direction of beam patterns generated by the antenna array (e.g., antenna array 311 of FIG. 3) is directed towards the third surface 301-3. In order to maintain the directionality of the beam radiated from the antenna array (e.g., the antenna array 311 of FIG. 3), the housing 301 may be configured so that a certain area of the third surface 301-3 corresponding to the area where the beam pattern of the antenna array is emitted may be made with a non-conductive member. The configuration of the housing 301 is not limited thereto, and the third surface 301-3 of the housing 301 may be entirely made of a non-conductive member. If the third surface 301-3 is made of a non-conductive member, and the second surface 301-2 and the third surface 301-3 are of different materials, then the second surface 301-2 and the third surface 301-3 of the housing 301 may be made via double shot injection molding, or after separately molding the second surface 301-2 and the third surface 301-3, the molded second surface 301-2 and the molded third surface 301-3 may be coupled or bonded together. When a part of the third surface 301-3 is a non-conductive member, the housing 301 may be made by double shot injection molding.

Figure 5A:
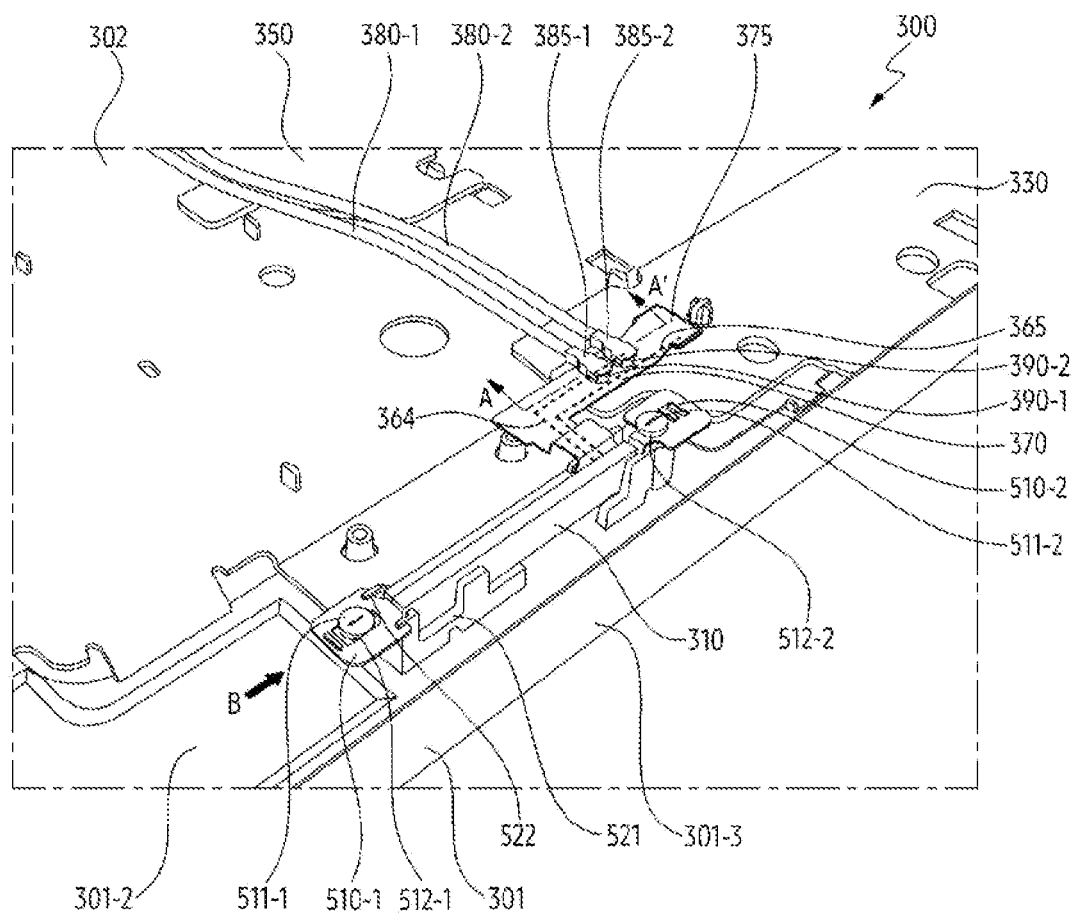
FIG. 5A is a perspective view illustrating the periphery of an antenna module of an electronic device according to an embodiment.

According to an embodiment, the antenna module 310 may include a first flexible printed circuit board 370, and the first flexible printed circuit board 370 may include a first connector 390 (390-1 and 390-2) and a second connector 375 (shown in FIG. 5A).

The antenna module 310 may be made of a plurality of layers, and may be formed either integrally with or separately from the first flexible printed circuit board 370. According to an embodiment, the antenna module 310 may include a rigid-flexible printed circuit board (RFPCB) that is a flexible printed circuit board on a printed circuit board. For example, the antenna module 310 may include an antenna array (e.g., antenna array 311 of FIG. 3) formed on a printed circuit board, an RFIC (e.g., RFICs of FIG. 2 (i.e., first RFIC 222, second RFIC 224, and third RFIC 226 of FIG. 2) or RFIC 313 of FIG. 3), and/or a PMIC (e.g., power management module 188 of FIG. 1), and it may further include a first flexible printed circuit board 370 extending from the printed circuit board.

According to one embodiment, the antenna array 311 may be formed in one surface of the substrate of the antenna module 310 facing the third surface 301-3 of the housing 301 or a layer of the printed circuit board close to the one surface. The RFIC 313 and/or the PMIC 315 may be formed on other surface distinct from the one surface of the substrate of the antenna module 310. In order to electrically connect the RFIC 313 and the antenna array 311, the printed circuit board may include a via and a transmission line connecting the RFIC 313 and the antenna array 311. The first flexible printed circuit board 370 may extend from one of a plurality of layers forming the printed circuit board. In the one layer may be printed a transmission line (e.g., fourth transmission line 364 or fifth transmission line 365 of FIG. 3) electrically connected to the RFIC 313 and/or the PMIC 315. The printed circuit board may include a conductive via for electrically connecting the transmission line with the RFIC 313 and/or the PMIC 135. The printed transmission line may extend to a transmission line printed on one layer of the first flexible printed circuit board 370. For example, the first flexible printed circuit board 370 may include a portion of transmission lines extending from the RFIC 313 and/or the PMIC 315.

As described above, the electronic device 300 according to an embodiment may include the antenna module 310 either integrally with or separated from the first flexible printed circuit board 370. The second printed circuit board 330 may support at least part of the first flexible printed circuit board 370. According to an embodiment, the antenna module 310 formed integrally with the first flexible printed circuit board 370 makes it possible to omit a connector for connection with the first flexible printed circuit board 370, for alleviating or reducing loss of the transmission signal between the RFIC 313 and the processor or the IFIC (e.g., a fourth RFIC 228 of FIG. 2 or an IFIC 353 of FIG. 3) included in the first printed circuit board 350, which may be caused by the connector for connection in between the first flexible printed circuit board 370 and the antenna module 310.

According to an embodiment, the first flexible printed circuit board 370 may include in one surface a first connector 390 (390-1 and 390-2) for connection with the coaxial cable 380 (380-1 and 380-2) and/or a second connector 375 for connection with the second printed circuit board 330. The first flexible printed circuit board 370 may include transmission lines (e.g., fourth transmission line 364 or fifth transmission line 365 of FIG. 3) having a conductive pattern on a coverlay film (e.g., a polyimide (PI) film). In the area corresponding to one end of the fourth transmission line 364, the coverlay film forming one surface of the first flexible printed circuit board 370 may be removed to expose the end of the fourth transmission line. The fourth transmission line may include two signal transmission lines for transmitting signals having vertical polarization wave and signals having horizontal polarization wave, respectively. The first flexible printed circuit board 370 may include a first connector 390 (390-1 and 390-2) connected to each of the exposed ends of the fourth transmission lines. According to an embodiment, the first flexible printed circuit board 370 may have a second connector 375 in the area corresponding to one end of the fifth transmission line 365. The second connector 375 may be electrically connected to the fifth transmission line, which is a signal line and/or a transmission line included in the first flexible printed circuit board 370. The second connector 375 may be configured to electrically connect the first flexible printed circuit board 370 and the second printed circuit board 330 to each other.

When the coaxial cable 380 (380-1 and 380-2) is fastened to a connector for electrically connecting to the second printed circuit board 330, signal loss may occur in the second connector 375 and thus, signal loss may occur due to the signal transmission line of the second printed circuit board 330. According to one embodiment, the processor 351 transmits signals to the antenna module 310 through the first flexible printed circuit board 370 including the first connector 390 (390-1 and 390-2) fastened to the coaxial cable 380 (380-1 and 380-2), and therefore, the number of connectors positioned in the signal transmission path can be reduced. Since the coaxial cable 380 (380-1 and 380-2) may be connected to the first connector 390 (390-1 and 390-2) to directly transmit transmission signals to the antenna module 310, the electronic device 300 according to an embodiment can alleviate or reduce the occurrence of signal loss due to the transmission line (e.g., micro-strip) in the second connector 375 and the second printed circuit board 330.

In order to reduce the signal loss of signals transmitted to the antenna module, the coaxial cable 380 (380-1 and 380-2) may be coupled to the first connector 390 (390-1 and 390-2) electrically connected to the transmission line of the first flexible printed circuit board 370, and may be coupled to the third connectors (e.g., third connectors 391-1 and 391-2 of FIG. 3) electrically connected to antenna signal transmission lines of the first printed circuit board 350 (e.g., a seventh transmission line 367 (367-1 and 367-1) of FIG. 3). The coaxial cable 380 (380-1 and 380-2) may connect the processor 351 or IFIC 353 included in the first printed circuit board 350 and the RFIC 313 included in the antenna module 310.

According to an embodiment, the second flexible printed circuit board 371 may be configured to connect the first printed circuit board 350 and the second printed circuit board 330 to each other. The second flexible printed circuit board 371 may include a plurality of coverlay films and conductive patterns printed on at least one of the plurality of coverlay films. The conductive patterns may include a control signal line for transmitting signals from the first printed circuit board 350 to the antenna module 310, and may further include a power supply line and/or a ground line. The signals carried through the control signal line may include signals transmitted from the processor for controlling the RFIC and/or PMIC.

According to an embodiment, the electronic device 300 may include a first antenna module 310-1 and/or a second antenna module 310-2. According to one embodiment, the first antenna module 310-1 may be disposed spaced apart from one edge of the third surface 301-3, and the second antenna module 310-2 may be disposed spaced apart from one of the other edges distinguished from the one edge of the third surface 301-3. For example, the first antenna module 310-1 map be disposed in between one edge of the third surface 301-3 and one edge of the bracket 302 facing the one edge of the third surface 301-3. The second antenna module 310-2 may be disposed in between the opposite edge of the third surface 301-3 facing the one edge of the third surface 301-3 and the opposite edge of the bracket 302 facing the opposite edge of the third surface 301-3. The first antenna module 310-1 and/or the second antenna module 310-2 may selectively operate under the control of the processor 351 to receive/transmit signals from/to a base station, depending on the direction of base stations arranged outside the electronic device 300. The first antenna module 310-1 and/or the second antenna module 310-2 may process signals generated by a processor (e.g., processor 351 of FIG. 3) to transmit 5G RF signals through the antenna array (e.g., antenna array 311 of FIG. 3).

In another example, the electronic device 300 may further include a third antenna module (not shown) spaced apart from one of the remaining edges distinct from the one edge of the third surface 301-3 and the other edge. The third antenna module may transmit/receive signals to/from a first cellular network (e.g., first cellular network 292 of FIG. 2).

According to an embodiment, the electronic device 300 may include a first flexible printed circuit board 370-1, a second flexible printed circuit board 371-1, a second printed circuit board 330-1 and/or coaxial cables (380-1 and 380-2), for electrical connection between the first antenna module 310-1 and the first printed circuit board 350, and may further include a third flexible printed circuit board 370-2, a fourth flexible printed circuit board 371-2, a third printed circuit board 330-2, and/or coaxial cables 380-3 and 380-4, for electrical connection between the second antenna module 310-2 and the first printed circuit board 350.

The first antenna module 310-1, the first flexible printed circuit board 370-1, the second flexible printed circuit board 371-1, the second printed circuit board 330-1 and/or the coaxial cables 380-1 and 380-2 may substantially have the same configuration as the antenna module 310, the first flexible printed circuit board 370, the second flexible printed circuit board 371, the second printed circuit board 330-1, and/or the coaxial cables 380-1 and 380-2. Further, the second antenna module 310-2, the third flexible printed circuit board 370-2, the fourth flexible printed circuit board 371-2, and/or the third printed circuit board 330-2 may have the configuration similar to each of the aforementioned components, and may be arranged between the other edge of the third surface in which the second antenna module 310-2 is disposed and the edge of the first printed circuit board 350 facing the other edge of the third surface. The coaxial cables 380-3 and 380-4 may be connected to a connector for a coaxial cable formed on the third flexible printed circuit board 370-2 and extend from the connector to the first printed circuit board 350. The coaxial cables 380-3 and 380-4 may be fastened to a connector for a coaxial cable positioned on the first printed circuit board 350.

As described above, according to an embodiment, the electronic device 300 may be configured to integrate the antenna module 310 and the first flexible printed circuit board 370 to reduce the number of connectors on the signal transmission path. An electronic device 300 such as e.g., a tablet PC or a notebook supporting the cellular communication, in particular, communications in a high frequency band such as e.g., mmWave may have a longer travelling path of signal transmission extending from the first printed circuit board 350 having the processor 351 to the antenna module 310 than smaller electronic devices (e.g., smartphone), and therefore, the amount of signal loss of the electronic device 300 may be greater than that of smaller electronic devices. According to an embodiment, in the electronic device 300, at least part of the feeding line transmitting signals from the processor 351 to the antenna module 310 may be made of a coaxial cable. Placing the antenna module (e.g., the RFIC of the antenna module) or the processor (or IFIC) adjacent to the connector of the coaxial cable makes it possible to reduce the length of the feeding line.

The electronic device 300 according to an embodiment can reduce signal loss of signals to be transmitted through the antenna, by integrating the antenna module 310 and the first flexible printed circuit board 370 including the connector 390 (390-1 and 390-2) for the coaxial cable 380 (380-1 and 380-2).

Figure 5B:
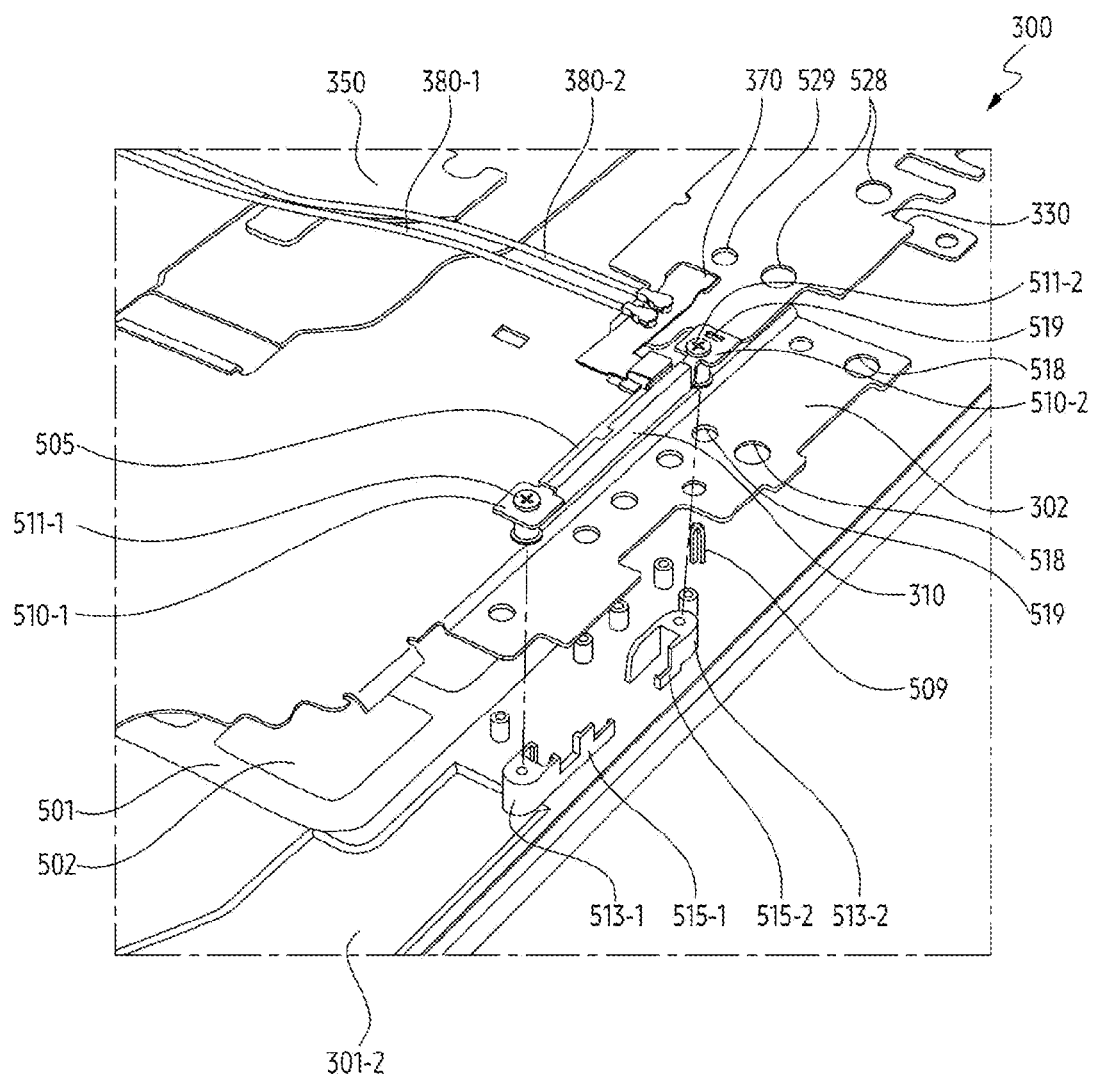
FIG. 5B is an exploded perspective view of the electronic device of FIG. 5A.

FIG. 5A is a perspective view illustrating the periphery of an antenna module of an electronic device according to an embodiment, and FIG. 5B is an exploded perspective view of the electronic device of FIG. 5A.

Referring to FIGS. 5A and 5B, the electronic device 300 may be arranged with the second printed circuit board 330 and the coaxial cables 380-1 and 380-2 in the vicinity of the antenna module 310.

In order to reduce the loss of high frequency transmission signals delivered from the antenna module 310, the antenna module 310 may be arranged in the vicinity of the coaxial cables 380-1 and 380-2. According to this arrangement, shortening the signal travelling path to the coaxial cables 380-1 and 380-2 enables the antenna module 310 to reduce the signal loss.

The coaxial cable connectors 385-1 and 385-2 formed on the coaxial cable may be fastened to the first connectors 390-1 and 390-2 of the first flexible printed circuit board 370. With such fastening, the coaxial cables 380-1 and 380-2 may be electrically connected to the first flexible printed circuit board 370. The coaxial cables 380-1 and 380-2 may be supported by attachment to the first flexible printed circuit board 370. The first flexible printed circuit board 370 is flexible, and therefore, the electronic device 300 may require a fixing member capable of fixing the first connectors 390-1 and 390-2 of the first flexible printed circuit board 370 and the connectors 385-1 and 385-2 of the coaxial cables. For the fixing member for fixing the connectors, reference will be made to the description of FIGS. 6A and 6B below.

According to an embodiment, in order to fix the first flexible printed circuit board 370, the first flexible printed circuit board 370 may be supported by a rigid fixing member. For example, a portion of the first flexible printed circuit board 370 may be supported by the second printed circuit board 330. This support may put restrictions on the movement of the first flexible printed circuit board 370 in the direction facing the second surface 301-2.

According to an embodiment, the antenna module 310 may be configured so that the printed circuit board and the first flexible printed circuit board 370 are formed either integrally or separately. According to an embodiment, the other end of the first flexible printed circuit board 370 may be fixed to the substrate of the antenna module 310 when it is integrally formed with the antenna module 310.

According to an embodiment, the first flexible printed circuit board 370 may include at least part of the fourth transmission line 364 and/or the fifth transmission line 365. The fourth transmission line 364 may be partially disposed on the substrate of the antenna module 310 to be electrically connected to the RFIC (e.g., RFIC 313 of FIG. 3) of the antenna module 310, and may extend from the RFIC to the first connectors 390-1 and 390-2 through the substrate and/or the first flexible printed circuit board 370. The fifth transmission line 365 may be partially disposed on the substrate of the antenna module 310 to be electrically connected to an integrated circuit (e.g., RFIC 313 and/or PMIC 315 of FIG. 3) included in the antenna module 310, and may extend from at least one integrated circuit included in the antenna module 310 to be electrically connected to the second connector 375 through the substrate and/or the first flexible printed circuit board 370. In another example, the fourth transmission line 364 and/or the fifth transmission line 365 may be connected to a connector (not shown) formed between the first flexible printed circuit board 370 and the substrate of the antenna module 310.

According to one embodiment, the first flexible printed circuit board 370 can be fixed when the second printed circuit board 330 is supporting the first flexible printed circuit board 370, and when the antenna module 310 is formed integrally with the first flexible printed circuit board 370. With such fixing, the first flexible printed circuit board 370 and the first connectors 390-1 and 390-2 can maintain their specified positions in the internal space within the housing 301.

According to an embodiment, the antenna module 310 may be fixed to the inner space of the housing 301. The electronic device 300 may include fixing members for fixing the antenna module 310 and the second surface 301-2 of the housing 301. For example, the housing 301 may include protrusions 513-1 and 513-2 protruding from the second surface 301-2 of FIG. 6 toward the first surface 301-1 and having screw grooves. The housing 301 may include a first seating groove 515-1 extending from the protrusion 513-1 having a first screw groove toward the protrusion 513-2 having a second screw groove, and supporting part of the antenna module 310, and a second seating groove 515-2 extending from the protrusion 513-2 having the second screw groove toward the protrusion 513-1 having the first screw groove, and supporting the other part of the antenna module 310. The electronic device 300 may include a module support member 505 surrounding one surface of the antenna module 310. Both ends of the module support member 505 may include flanges 510-1 and 510-2 that includes openings into which screws 511-1 and 511-2 are inserted. The antenna module 310 and/or the module support member 505 supporting the antenna module 310 may be configured to occupy a space defined by the first seating groove 515-2 and the second seating groove 515-2. The module support member 505 can fix the antenna module 310 to the housing 301 by coupling with the protrusions 513-1 and 513-2 using the screws 511-1 and 511-2 respectively.

According to one embodiment, the bracket 302 may include a plurality of openings for coupling with the second surface 301-2 of the housing 301. The housing 301 may include a plurality of protrusions corresponding to the plurality of openings vertically protruding from the second surface 301-2. At least one protrusion among the plurality of protrusions may have a screw groove.

According to an embodiment, the electronic device 300 may further include an opening 502 formed on the second surface 301-2 to expose a keypad frame 501 and/or a keypad. The keypad frame 501 and/or the opening 502 may be covered by the bracket 302 when viewed from the inner space. However, the configuration is not limited thereto, and the electronic device 300 may be an electronic device having no keypad, such as e.g., a tablet PC. Alternatively, the electronic device 300 may be implemented with a display (not shown) on the second surface 301-2, in place of the keypad frame 501 and/or the opening 502.

The second printed circuit board 330 may include one or more openings 528 and 529 corresponding to one or more openings 518 and 519 formed in the bracket 302.

According to an embodiment, the bracket 302 may be seated on the second surface 301-2 of the housing 301. The bracket 302 may be configured to be supported onto the second surface 301-2, by inserting the openings formed in the bracket 302 into corresponding protrusions of the plurality of protrusions of the second surface 301-2. For example, the protrusion 509 of the second surface 301-2 may be formed at a position corresponding to the opening 529 of the second printed circuit board 330. The protrusion 509 formed on the second surface 301-2 of the housing 301 may be inserted into the opening 519 of the bracket 302 and/or the opening 529 of the second printed circuit board 330. The second printed circuit board 330 may include an opening 528 corresponding to openings 518 of the plurality of openings of the bracket 302. After the second printed circuit board 330 is stacked on the bracket 302, coupling members may be inserted into the openings 518 of the bracket 302 and the openings 528 of the second printed circuit board 330 to fix the bracket 302 and the second printed circuit board 330. With such fixing, the second printed circuit board 330 may be fixed to and supported by the bracket 302.

According to an embodiment, the second printed circuit board 330 and the antenna module 310 may be seated on the housing 301 to be fixed to the internal space of the electronic device 300. With the fixing, the second printed circuit board 330 may stably support the first flexible printed circuit board 370. With the support, the movement of the first connectors 390-1 and 390-2 formed on the first flexible printed circuit board 370 may be reduced. The coaxial cable connectors 385-1 and 385-2 may be formed at one end of the coaxial cables 380-1 and 380-2. The first connectors 390-1 and 390-2 may be physically and electrically connected to the coaxial cable connectors 385-1 and 385-2. By fixing of the first flexible printed circuit board 370, the first connectors 390-1 and 390-2 may maintain connection with the coaxial cable connectors 385-1 and 385-2. Due to the maintaining of the connection, the antenna module 310 can maintain a stable electrical connection with the first printed circuit board 350, and transmit transmission signals to the processor (e.g., a processor 351 of FIG. 3) disposed on the first printed circuit board 350.

As described above, according to an embodiment, the antenna module 310 and the first flexible printed circuit board 370 may be integrated, and the first connectors 390-1 and 390-2 of the coaxial cables 380-1 and 380-2 in the first flexible printed circuit board 370 may be formed, so as to reduce the number of connectors on the travelling path of the signal, therefore reducing the signal loss resulting from the connectors. In the electronic device 300, such as a tablet PC or a laptop computer supporting RF communication, signals transmitted to the antenna may employ a longer travelling path compared to signals in mobile phones, and thus signal loss may be larger. In order to reduce signal loss of transmission signals transmitted from the antenna module 310, the antenna module 310 may be disposed in the vicinity of the coaxial cables 380-1 and 380-2. With the arrangement, the antenna module 310 can reduce the signal loss by shortening the travelling path of the transmission signal up to the coaxial cables 380-1 and 380-2.

Figure 6A:
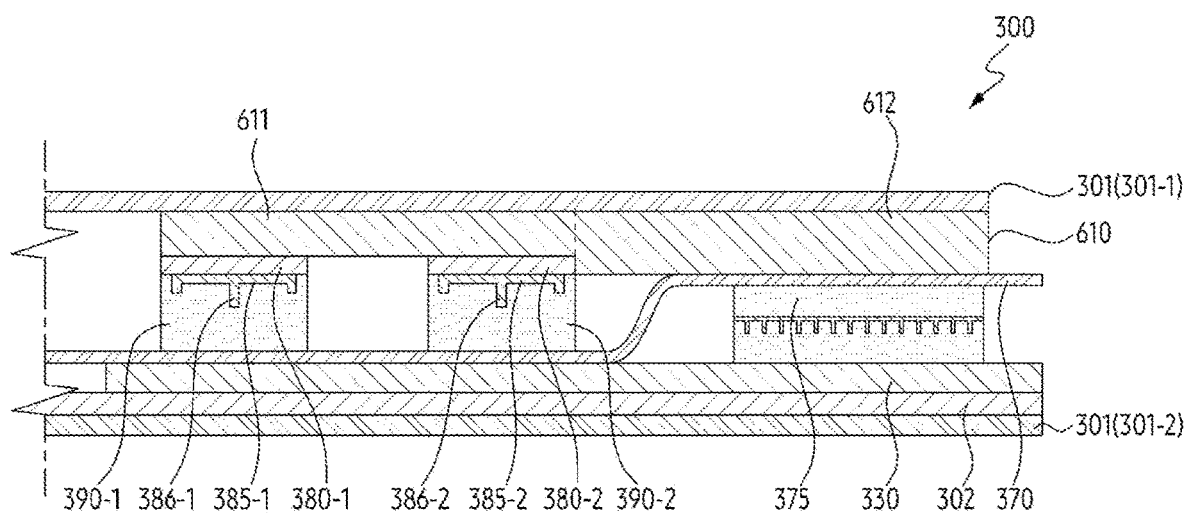
FIG. 6A is a cross-sectional view illustrating an example taken along line A-A' of FIG. 5A.
Figure 6B:
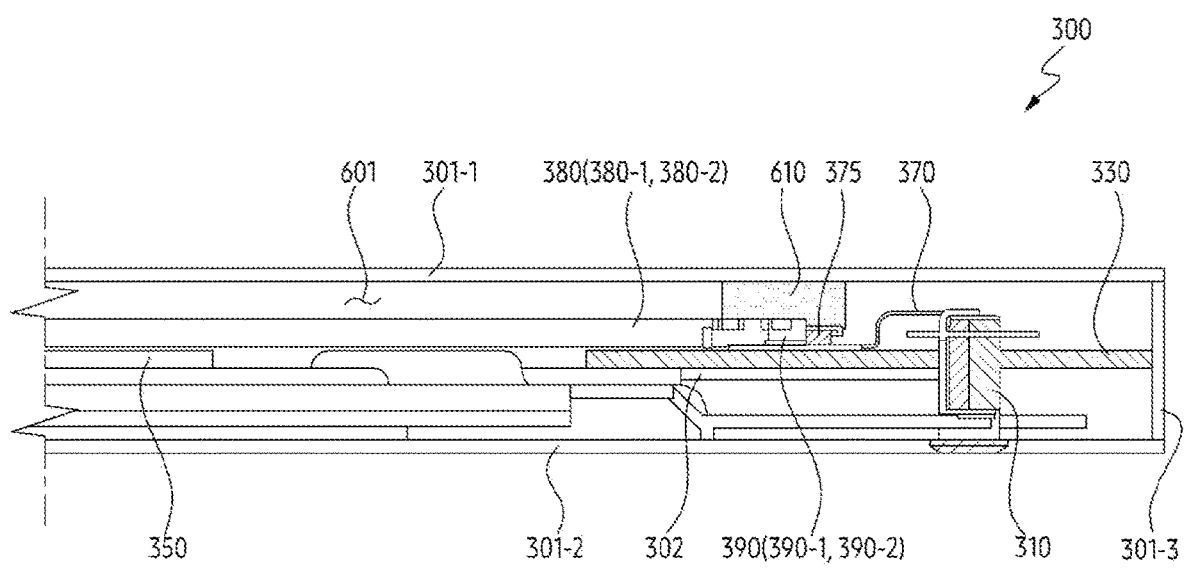
FIG. 6B is a side view illustrating an example viewed from a direction B shown in FIG. 5A.

FIG. 6A is a cross-sectional view illustrating an example taken along line A-A' of FIG. 5A, and FIG. 6B is a side view illustrating an example viewed from a direction B shown in FIG. 5A.

Referring to FIGS. 6A and 6B, the electronic device 300 may include a housing 301, a bracket 302, an antenna module 310, a second printed circuit board 330, a first flexible printed circuit board 370, coaxial cables 380-1 and 380-2, and/or a fixing member 610.

According to an embodiment, the housing 301 may include a first surface 301-1 and a second surface 301-2 facing the first surface 301-1, being spaced apart from each other to define the inner space 601. The second surface 301-2 of the housing 301 may support various components of the electronic device 300 arranged within the inner space 601. The housing 301 may be made of a non-conductive material, although the configuration is not limited thereto.

According to an embodiment, the bracket 302 may be disposed in the inner space 601 of the housing 301. The housing 301 may support the bracket 302. For example, one surface of the bracket 302 may be disposed on the second surface 301-2 of the housing 301. The bracket 302 may be coupled with the housing 301 and a fastening member (e.g., screw or hook) to be seated on the second surface 301-2 of the housing 301. The bracket 302 may be made of a rigid conductive material. The bracket 302 may fix and support the components of the electronic device 300 arranged within the inner space. The bracket 302 may provide the ground to the components of the electronic device 300 arranged within the inner space, and may radiate heat generated from the components to the outside of the device.

According to an embodiment, the antenna module 310 may be disposed in the inner space 601 of the housing 301. The antenna module 310 may be supported onto part of the bracket 302 and/or the second surface 301-2 of the housing 301. The antenna module 310 may be disposed adjacent to a portion of the housing 301 including a non-conductive member for transmission and reception of transmission signals. For example, the antenna module 310 may be disposed adjacent to the third surface 301-3 of the housing 301. One surface of the substrate of the antenna module 310 in which its antenna array (e.g., antenna array 311 of FIG. 3) may be disposed to face the third surface 301-3, so that the beam directionality of the antenna module 310 faces the third surface 301-3 of the housing 301.

According to an embodiment, the second printed circuit board 330 may be disposed on a surface of the bracket 302 facing opposite the surface of the bracket 302 in contact with the second surface 301-2 of the housing 301. The second printed circuit board 330 may be supported by the bracket 302. The second printed circuit board 330 may be configured to supply power to the antenna module (e.g., antenna module 310 of FIG. 3), or transmit control signals supplied from the first printed circuit board (e.g., a first printed circuit board 350 of FIG. 3) the antenna module 310.

According to an embodiment, the second connector 375 may be fastened to and supported by the connector of the second printed circuit board 330. The second connector 375 may electrically connect the first flexible printed circuit board 370 and the second printed circuit board 330 to each other. The second connector 375 may include a socket connector and a plug connector. The first flexible printed circuit board 370 and the second printed circuit board 330 may be electrically connected to each other by way of the coupling between the socket connector and the plug connector. For example, the first flexible printed circuit board 370 may include the plug connector, and the second printed circuit board 330 may include the socket connector capable of accommodating pins of the plug connector. Coupling of the plug connector and the socket connector makes it possible for the transmission line of the first flexible printed circuit board 370 and the transmission line of the second printed circuit board 330 to be coupled to each other.

According to an embodiment, the first flexible printed circuit board 370 may be supported by the second printed circuit board 330. The first flexible printed circuit board 370 may include a coverlay film and a copper foil pattern. The coverlay film may be made of a flexible material (e.g., polyimide (PI), or the like). The first flexible printed circuit board 370 has flexibility, and therefore, it is possible to form coupling between boards with different heights. For example, the first flexible printed circuit board 370 may include a surface in contact with the antenna module 310. The first flexible printed circuit board 370 may be bent from the surface in contact with the antenna module, which is spaced apart from the second printed circuit board 330, and bent toward the second printed circuit board 330 while extending parallel to the second printed circuit board 330. The first flexible printed circuit board 370 bent toward the second printed circuit board 330 may extend to a surface of the second printed circuit board 330 and be bent to extend along the surface of the second printed circuit board 330, such that the surface of the antenna module 310 in contact with the first flexible printed circuit board 370 and the surface of the second printed circuit board 330 in contact with the first flexible printed circuit board 370 are at different elevations. The first flexible printed circuit board 370 may include first connectors 390-1 and 390-2 disposed on a surface opposite the surface in contact with the second printed circuit board 330, in an area extending along the surface of the second printed circuit board 330.

According to one embodiment, one end of the first flexible printed circuit board 370 may be fixed to the second printed circuit board 330 by the second connector 375, and fixed to a surface of the antenna module 310. Because the first flexible printed circuit board 370 has flexibility, the first connectors 390-1 and 390-2 may be subject to shaking or vibration when the electronic device 300 is in use or while it is moved. With accumulation of the vibration or shaking, the first connectors 390-1 and 390-2 may be separated from the coaxial cable connectors 385-1 and 385-2. As a solution to preventing such separation, the electronic device 300 may further include a fixing member 610.

The first flexible printed circuit board 370 may be configured so that its one surface faces the second printed circuit board, and its other surface opposite the one surface faces the fixing member 610. A portion of the second connector 375 (e.g., plug connector) may be formed on one surface of the first flexible printed circuit board 370, and the other surface of the first flexible printed circuit board 370 may include the first connectors 390-1 and 390-2 coupled to the coaxial cable connectors 385-1 and 385-2. The coaxial cable connectors 385-1 and 385-2 may include pins 386-1 and 386-2 extending from the signal transmission lines of the coaxial cables 380-1 and 380-2 (e.g., signal transmission lines 381-1 and 381-2 of FIG. 3). The first connectors 390-1 and 390-2 may be coupled to the pins 386-1 and 386-2. With such coupling, the coaxial cables 380-1 and 380-2 may be electrically coupled to the fourth transmission lines (e.g., fourth transmission lines 364-1 and 364-2 of FIG. 3).

According to one embodiment, the fixing member 610 may apply pressure to the coaxial cable connectors 385-1 and 385-2 formed at the ends of the coaxial cables 380-1 and 380-2 and/or the second connector 375. The fixing member 610 may be integrally formed with the housing 301 or may be attached to the housing 301. The fixing member 610 may protrude from the first surface 301-1 of the housing 301 toward the second surface 301-2 thereof.

According to one embodiment, when the first surface 301-1 and the second surface 301-2 of the housing 301 are assembled to cause the housing 301 to be fastened, the fixing member 610 may come into contact with one surface of the coaxial cable connectors 385-1 and 385-2 facing the first surface 301-1, and the first flexible printed circuit board 370 overlapping the second connector 375 facing the first surface 301-1. The fixing member 610 may apply pressure to the coaxial cable connectors 385-1 and 385-2 and one connector (e.g., plug connector) including one surface of the second connector 375, and the fixing member 610 may transfer the pressurized force to the first connectors 390-1 and 390-2 and the remaining connector (e.g., a socket connector) of the second connector 375.

According to one embodiment, the shape of the pressing surface of the fixing member 610 (e.g., the surface facing the first connector 390 and the second connector 375) may be formed to come into contact with the surface of the coaxial cable connectors 385-1 and 385-2 facing the first surface 301-1 and the surface of the first flexible printed circuit board 370 overlapping the second connector 375 facing the first surface 301-1. For example, the fixing member 610 may include a first region 611 overlapping the coaxial cable connectors 385-1 and 385-2 and/or the first connector 390, and a remaining, second region 612. With close contact of the fixing member 610 and the coaxial cable connectors 385-1 and 385-2 and with close contact of the fixing member 610 and the first flexible printed circuit board 370 on the second connector 375, the coaxial cable connectors 385-1 and 385-2 and the first connector 390 can be fixed. For fixing of the coaxial cable connectors 385-1 and 385-2 and the second connector 375, the fixing member 610 may have different heights of the first region 611 and the second region 612. The sum of the thickness of the first flexible printed circuit board 370 and the thickness of the second connector 375 may be different the sum of the thickness of the first flexible printed circuit board 370 and the thicknesses of the coaxial cable connectors 385-1 and 385-2 and the first connectors 390-1 and 390-2. Accordingly, there may be a difference in height between the first region 611 and the second region 612 corresponding to a difference in thickness between the thickness of the coaxial cable connectors 385-1 and 385-2 and the first connectors 390-1 and 390-2 disposed in the first region 611 and the thickness of the second connector 375 disposed in the second region 612. According to an embodiment, the fixing member 610 having different heights in the first area 611 and the second area may be configured to fix the first connectors 390-1 and 390-2 and the second connector 375. As described above, the electronic device 300 according to the embodiment may have the fixing member 610 with a step difference, in order to apply external forces to the coaxial cable connectors 385-1 and 385-2 and the first connectors 390-1 and 390-2. The fixing member 610 may be configured to prevent separation between the first connectors 390-1 and 390-2 and the coaxial cable connectors 385-1 and 385-2 in the first region 611 by the external force. The fixing member 610 may prevent separation of the second connector 375 in the second region 612 by the external force. According to an embodiment, the first flexible printed circuit board 370 can be at least partially supported by the second printed circuit board 330 and fixed by the fixing member 610, for increasing stability in using the electronic device product.

Figure 7:
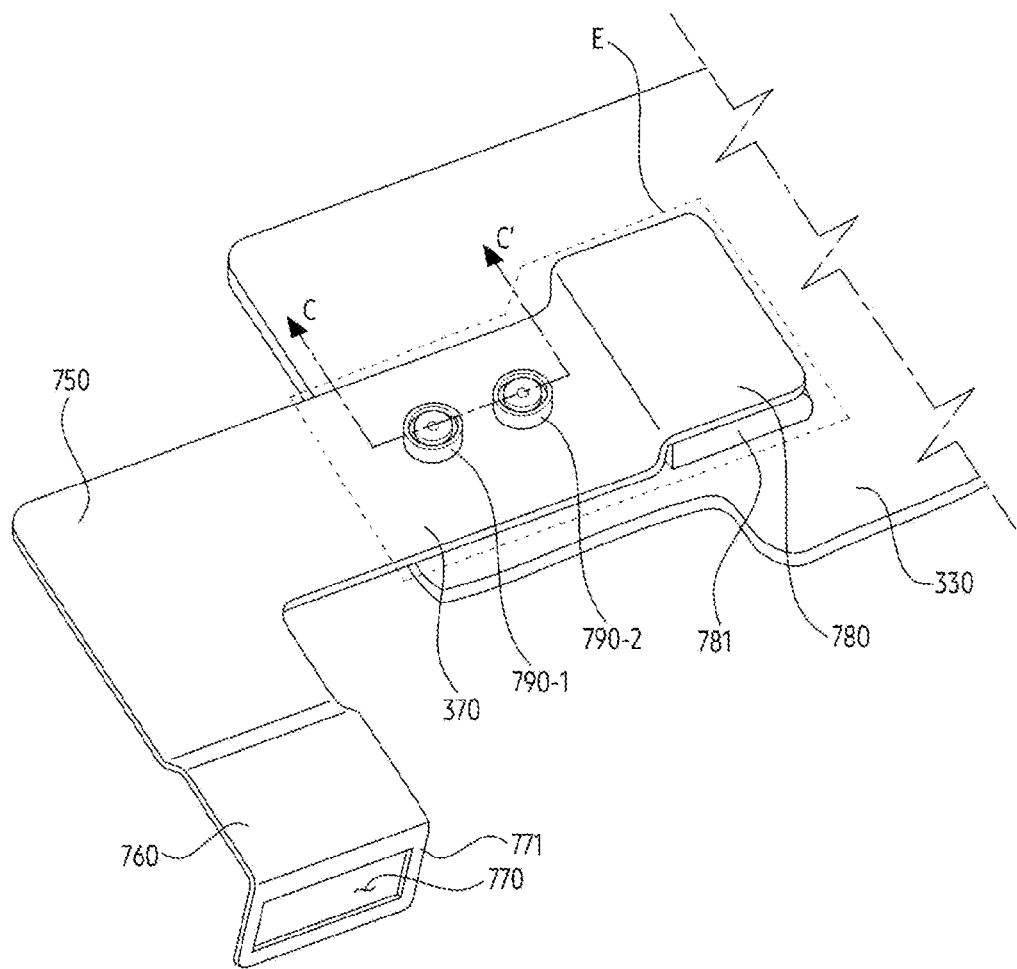
FIG. 7 is a perspective view illustrating an example of a first flexible printed circuit board of an electronic device according to an embodiment.

FIG. 7 is a perspective view illustrating an example of a first flexible printed circuit board of an electronic device according to an embodiment.

Referring to FIG. 7, the first flexible printed circuit board 370 may be supported by the second printed circuit board 330.

The first flexible printed circuit board 370 may include first connectors 790-1 and 790-2. The first connectors 790-1 and 790-2 may be connected to a coaxial cable (e.g., coaxial cables 38-1 and 380-2 of FIG. 4). The coaxial cables 380-1 and 380-2 may be a copper wire wrapped in a dielectric and may have flexibility, and the first flexible printed circuit board 370 may also be flexible. Due to such this flexibility, the first connectors 790-1 and 790-2 of the first flexible printed circuit board 370 may be subject to external vibrations, or vibrations or movements resulting from moving or shaking of the electronic device 300. Such movements or vibrations of these first connectors 790-1 and 790-2 may cause the first flexible printed circuit board 370 and the coaxial cable to separate from each other. When the second printed circuit board 330 extends up to the position of the second connector 781, movement in the first connectors 790-1 and 790-2 can be reduced, so that the coaxial cables 380-1 and 380-2 can be firmly fixed.

According to an embodiment, the second printed circuit board 330 may support an area E of the first flexible printed circuit board 370. In order to support the area E in which the first connectors 790-1 and 790-2 are located of the area of the first flexible printed circuit board, the second printed circuit board 330 may extend from the second connector 781 toward the first connectors 790-1 and 790-2 (e.g., first connectors 390-1 and 390-2 of FIG. 4). The second printed circuit board 330 may support at least part of the first flexible printed circuit board 370. For example, the second printed circuit board 330 may include a substrate made of a rigid polymer material.

According to an embodiment, the first flexible printed circuit board 370 may include a first surface 780 in which the second connector 781 is located, a second surface 750 bent from the first surface 780 and extending toward the second printed circuit board 330, a third surface 760 bent from the second surface 750 and extending to an antenna module (e.g., antenna module 310 of FIG. 3), and a fourth surface 771 extending from the third surface 760 into the substrate of the antenna module. Transmission lines (e.g., signal transmission lines, power feeding lines, etc.) exposed to the surface 770 from which an outer coverlay of the fourth surface 771 is removed may be connected to patterns on the substrate of the antenna module, and the first flexible printed circuit board 370 may be formed integrally with the antenna module 310. However, the configuration is not limited thereto, and the antenna module 310 may be connected to the first flexible printed circuit board 370 by a connector.

According to an embodiment, the first surface 780 may be configured to be spaced apart from one surface of the second printed circuit board 330 by the height of the second connector 781. The second surface 750 may be bent as much as the height of the second connector 781 and extend so that its portion comes in contact with one surface of the second printed circuit board 330. According to one embodiment, the first flexible printed circuit board 370 may be fixed in the area E where the first connectors 790-1 and 790-2 and the second connector 781 are located, so that it is possible to prevent the separation of the coaxial cable and the first flexible printed circuit board 370. The second surface 750 may be formed to be in contact with the second printed circuit board 330 at least in the area E. As the area E of the second surface 750 comes into contact with the second printed circuit board 330, the movements of the first connectors 790-1 and 790-2 can be prevented. The electronic device 300 may include a fixing member (e.g., fixing member 610 of FIG. 6A) so that the area E of the second surface 750 is fixed to the first printed circuit board, for restraining the movements and shaking of the first connectors 790-1 and 790-2.

As described above, according to an embodiment, the second printed circuit board 330 may include the area E to support the area E of the first flexible printed circuit board 370. The first connectors 790-1 and 790-2 included in the area E may be supported by the second printed circuit board 330, which supporting allows the first flexible printed circuit board 370 and the coaxial cable to keep a stable coupling.

According to an embodiment, the first connectors 790-1 and 790-2 and the second connector 781 may be fixed by the fixing member 610 of FIGS. 6A and 6B, extending from the housing 301. According to an embodiment, the first connectors 790-1 and 790-2 and the second connector 781 may be supported by the second printed circuit board 330. The electronic device 300 may include the second printed circuit board 330 supporting the first connectors 790-1 and 790-2 and the second connector 781, and the fixing member 610 for fixing the first connectors 790-1 and 790-2 and the second connector 781, so it may require neither any separate supporting member for supporting the first connectors 790-1 and 790-2 and the second connector 781 nor any separate fixing member for fixing the first connectors 790-1 and 790-2 and the second connector 781. In other words, the electronic device 300 can reduce the space required for arranging the fixing member and the supporting member, thereby increasing availability of the internal space 601 and reducing the overall size of the terminal equipment.

Figure 8:
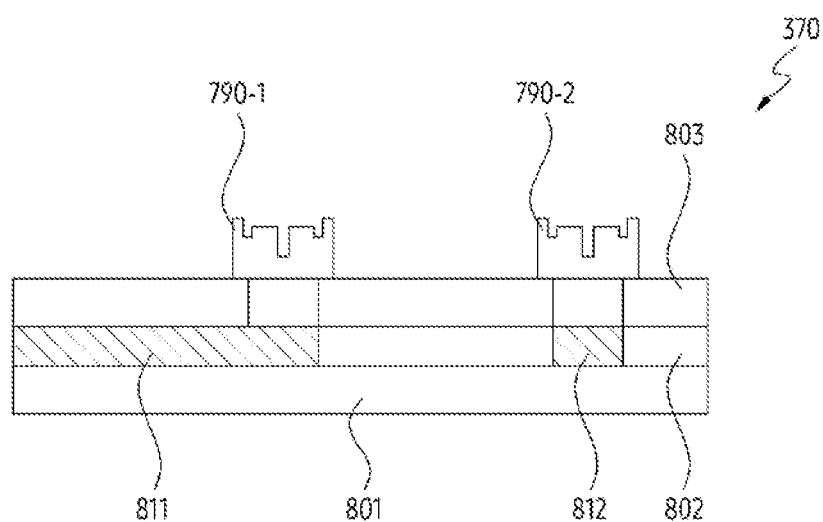
FIG. 8 is a cross-sectional view illustrating an example taken along line C-C' of FIG. 7.
Figure 9:
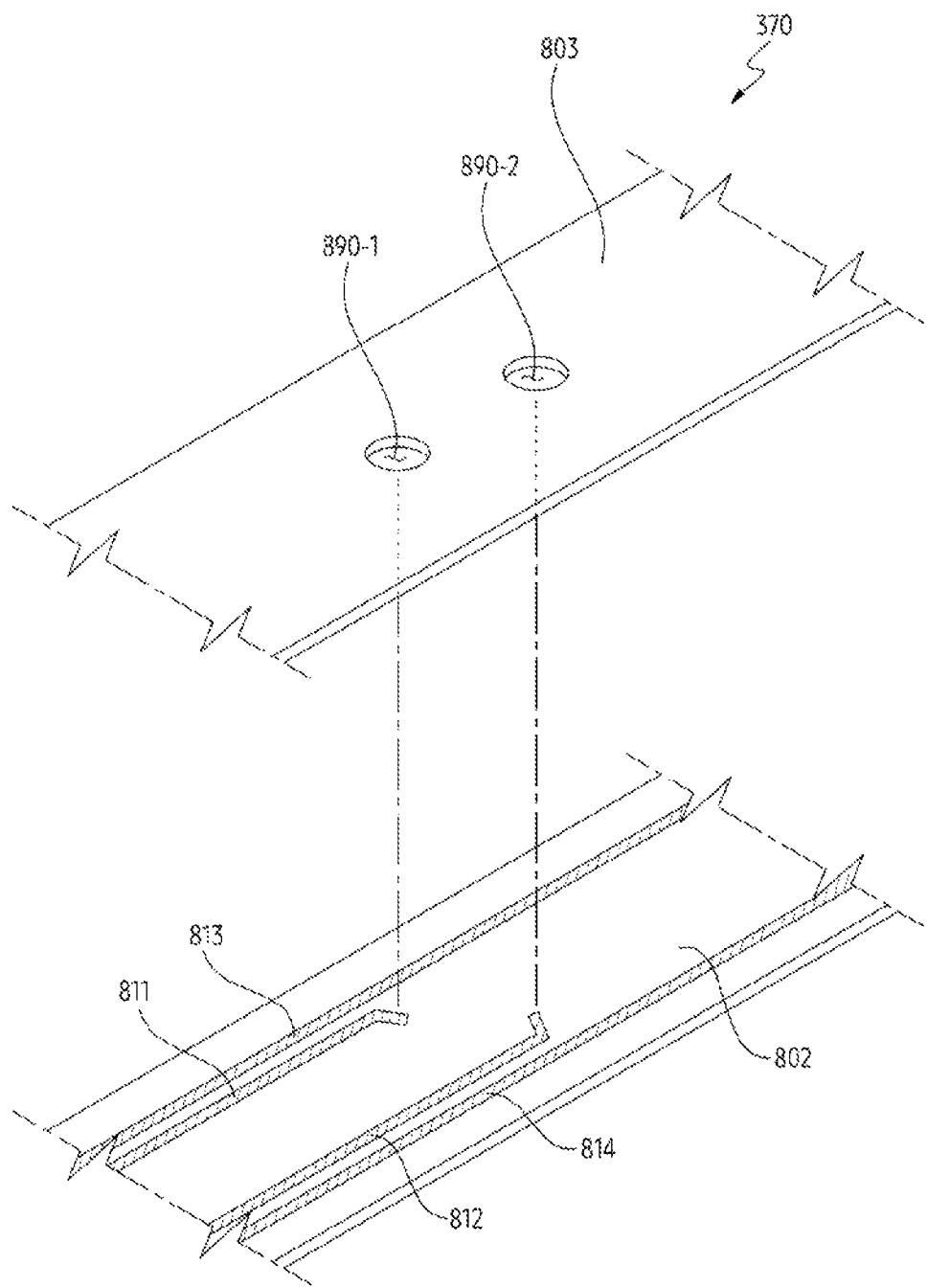
FIG. 9 is a portion of an exploded perspective view showing a first flexible printed circuit board of FIG. 7.

FIG. 8 is a cross-sectional view illustrating an example taken along line C-C' of FIG. 7, and FIG. 9 is a part of an exploded perspective view illustrating the first flexible printed circuit board of FIG. 7.

Referring to FIGS. 8 and 9, the first flexible printed circuit board 370 may include a first coverlay 801, a second coverlay 802, a third coverlay 803, a first antenna signal line 811 (e.g., fourth transmission line 364-1 of FIG. 3), a second antenna signal line 812 (e.g., another fourth transmission line 364-2 of FIG. 3), and/or first connectors 790-1 and 790-2.

According to an embodiment, the first coverlay 801, the second coverlay 802, and the third coverlay 803 may be made of a ductile material (e.g., polyimide (PI)).

According to an embodiment, the first antenna signal line 811 and the second antenna signal line 812 may be implemented as copper patterns. The first antenna signal line 811 and the second antenna signal line 812 may be formed by printing the copper pattern on the coverlay film. The first antenna signal line 811 and the second antenna signal line 812 may be electrically connected to the first connectors 790-1 and 790-2, respectively. The first connectors 790-1 and 790-2 may be coupled to coaxial cable connectors (e.g., coaxial cable connectors 385-1 and 385-2 of FIG. 5A). The first connectors 790-1 and 790-2 may transfer transmission signals to the first antenna signal line 811 and the second antenna signal line 812.

According to an embodiment, the method of manufacturing the first flexible printed circuit board 370 may include preparing the first coverlay 801. After the preparing, the manufacturing method may include forming the first antenna signal line 811 and the second antenna signal line 812 on the first coverlay 801. The forming of the first antenna signal line 811 and the second antenna signal line 812 may be carried out by printing metal on the first coverlay 801.

According to an embodiment, the metal printing may further include printing of signal lines 813 and 814 (e.g., fifth transmission line 365) different from the first antenna signal line 811 and the second antenna signal line 812. The other signal lines 813 and 814 may be formed on a layer (one side of an additional coverlay) different from the first antenna signal line 811 and the second antenna signal line 812. For example, the first flexible printed circuit board 370 may include an additional coverlay disposed between the second coverlay 802 and the third coverlay 803. The other signal lines 813 and 814 may be printed on the additional coverlay. Instead of printing the metal, a thin metal film may be applied on the first coverlay 801 to form the pattern of the first antenna signal line 811 and the second antenna signal line 812 using etching.

According to an embodiment, after the formation of the first antenna signal line 811 and the second antenna signal line 812, the second coverlay 802 may be applied, and additionally the third coverlay 803 may be applied. For installation of the first connectors 790-1 and 790-2, an opening may be formed onto the third coverlay 803 in the first flexible printed circuit board 370. Although the second coverlay 802 and the third coverlay 803 have been described as separate members, the configuration is not limited thereto, and the second coverlay 802 and the third coverlay 803 may be integrally formed as a single coverlay.

According to an embodiment, the third coverlay 803 may include openings 890-1 and 890-2 formed at positions passing through the third coverlay 803 and corresponding to the ends of the first antenna signal line 811 and the second antenna signal line 812. The first connectors 790-1 and 790-2 may be inserted into the openings 890-1 and 890-2 of the third coverlay 803 to be integrated with the first flexible printed circuit board 370. In another example, the openings 890-1 and 890-2 may be formed in the first coverlay 801 at positions corresponding to the ends of the first antenna signal line 811 and the second antenna signal line 812. The first connectors 790-1 and 790-2 may be inserted into the openings 890-1 and 890-2 of the third coverlay 803 to be integrally formed with the first flexible printed circuit board 370. In another example, the first flexible printed circuit board 370 may include a plurality of coverlays (not shown) distinct from the first coverlay 801, the second coverlay 802, and the third coverlay 803. The plurality of coverlays may be disposed between the second coverlay 802 and the third coverlay 803, and include openings corresponding to the openings 890-1 and 890-2 passing through the third coverlay 803. The first connectors 790-1 and 790-2 may be configured to pass through the openings 890-1 and 890-2 of the third coverlay 803 and the openings formed in the plurality of coverlays to come into contact with the first antenna signal line 811 and the second antenna signal line 812, and therefore, may be formed integrally with the first flexible printed circuit board 370. The other signal lines 813 and 814 may be patterned on at least one of the plurality of coverlays.

As described above, the first flexible printed circuit board 370 may include the antenna signal transmission lines 811 and 812 formed on one of the plurality of coverlays (or layers) making up the first flexible printed circuit board 370, and the first connectors 790-1 and 790-2 connected to the ends of the signal transmission lines 811 and 812.

The first connectors 790-1 and 790-2 may electrically connect the coaxial cables (e.g., coaxial cables 380 (380-1 and 380-2) of FIG. 3) and the signal transmission lines 811 and 812 of the first flexible printed circuit board 370. The coaxial cables 380-1 and 380-2 may transmit signals to the antenna module 310 via the first connectors 790-1 and 790-2 arranged in a position adjacent to the antenna module 310, for reducing the travelling path of the signal. Due to the reduced signal travelling path, the electronic device can reduce loss of the signal including information to be transmitted from the processor to the external electronic device.

Figure 10:
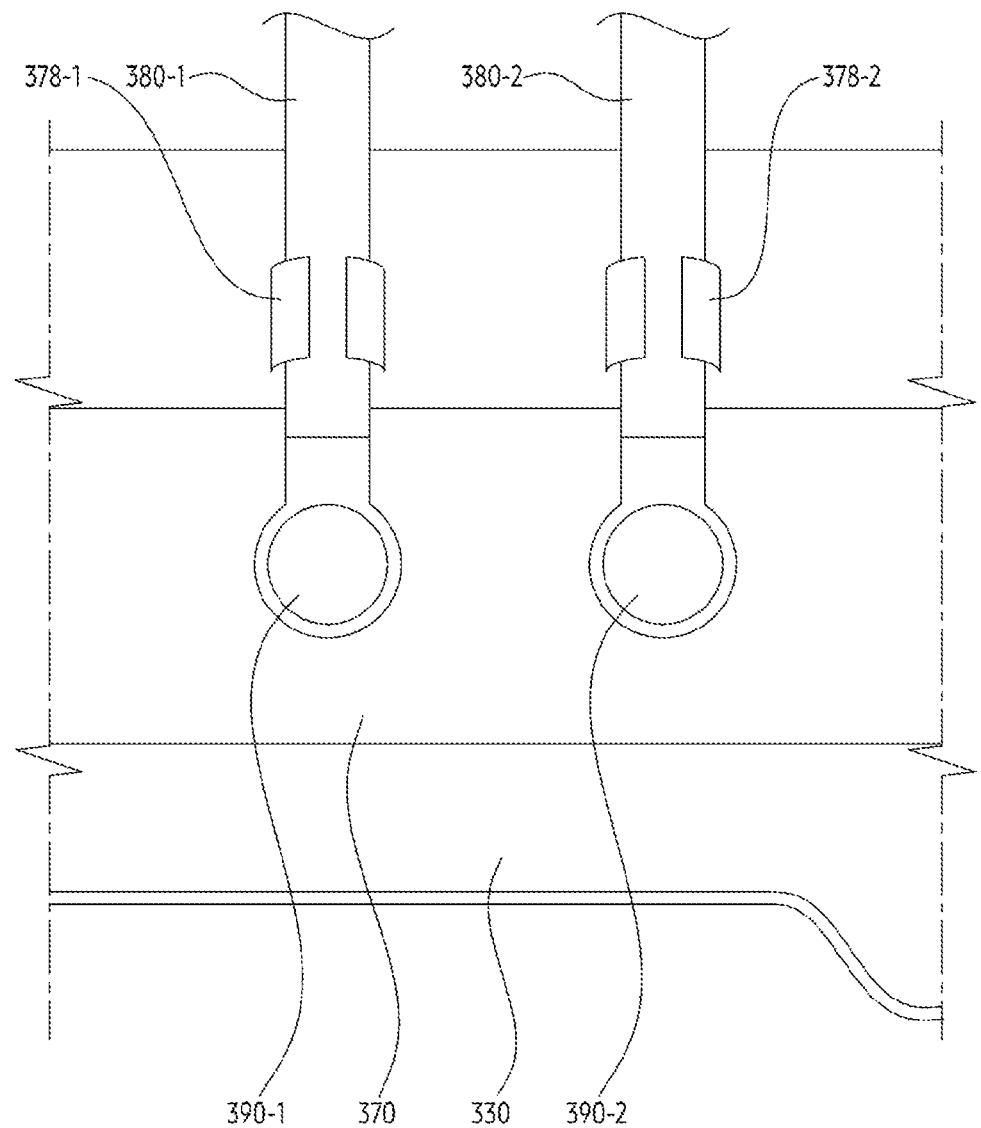
FIG. 10 is a plan view illustrating an example of a cable fixing structure of an electronic device according to an embodiment.

FIG. 10 is a plan view illustrating an example of cable fixing structure of an electronic device according to an embodiment.

Referring to FIG. 10, the second printed circuit board 330 may include coupling members 378-1 and 378-2 for fixing the coaxial cables 380-1 and 380-2 electrically connected to the first flexible printed circuit board 370.

According to an embodiment, the coupling members 378-1 and 378-2 may be spaced apart from the first flexible printed circuit board and disposed on one surface of the second printed circuit board 330. The coupling members 378-1 and 378-2 may be disposed to be spaced apart from each other. Each of the coupling members 378-1 and 378-2 may be coupled with a corresponding coaxial cable 380-1 and 380-2 to fix the ends of the coaxial cables (380-1 and 380-2).

The coupling members 378-1 and 378-2 may extend from one surface of the second printed circuit board 330 in the vertical direction and include two plates having a curved shape surface corresponding to the shape of the coaxial cable. The two plates of the coupling members 378-1 and 378-2 are elastic and can be spaced apart, for fastening of the coaxial cables 380-1 and 380-2. When the coaxial cables 380-1 and 380-2 are fitted to the coupling members 378-1 and 378-2, the coupling members 378-1 and 378-2 may be adjusted to correspond to the shape of the coaxial cables 380-1 and 380-2 by the elasticity.

As described above, according to an embodiment, the coupling members 378-1 and 378-2 can fix the ends of the coaxial cables 380-1 and 380-2, so that the coaxial cable connectors 385-1 and 385-2 of the coaxial cable 380-1 and 380-2 can help keep the coupling with the first connectors (e.g., first connectors 390-1 and 390-2 of FIG. 3). Thus, the electronic device 300 can transmit stable transmission signals from the processor to the antenna module or from the antenna module to the processor, by maintaining the coupling of the coaxial cable.

In accordance with an embodiment described above, provided is an electronic device (e.g., an electronic device 300 of FIG. 3) comprising an antenna module (e.g., an antenna module 310 of FIG. 3) including an antenna array (e.g., an antenna array 311 of FIG. 3), a radio frequency integrated circuit (RFIC) (e.g., an RFIC 313 of FIG. 3) connected with the antenna array and a first flexible printed circuit board connected with the RFIC; a first connector (e.g., one of first connectors 390-1 and 390-2 of FIG. 3) disposed on the first flexible printed circuit board; a communication processor (e.g., a processor 351 of FIG. 3) disposed on a first printed circuit board; a coaxial cable (e.g., coaxial cables 380-1 and 380-2 of FIG. 3) electrically connecting the first flexible printed circuit board and the communication processor via first the connector; and a second printed circuit board (e.g., a second printed circuit board 330 of FIG. 3) electrically connecting the communication processor and the first flexible printed circuit board, the second printed circuit board being distinct from the first printed circuit board; wherein the communication processor may be configured to provide a data signal to be transmitted to an external electronic device, to the RFIC along a first path in the first flexible printed circuit board through the coaxial cable and the first connector, and provide a control signal to the RFIC along a second path in the first flexible printed circuit board distinct from the first path, through the second printed circuit board; wherein the data signal provided to the RFIC may be up-converted in the RFIC, based on the control signal; and wherein the up-converted signal may be transmitted to the external electronic device through the antenna array.

According to an embodiment, the electronic device further comprises a second flexible printed circuit board (e.g., a second flexible printed circuit board 371 of FIG. 3) distinct from the first flexible printed circuit board, connecting the first printed circuit board and the second printed circuit board, wherein the first printed circuit board may include a first transmission line (e.g., a first transmission line 361 of FIG. 3) extending from the communication processor, wherein the second flexible printed circuit board may include a second transmission line (e.g., a second transmission line 362 of FIG. 3) electrically connected to the first transmission line, wherein the second printed circuit board may include a third transmission line electrically connected to the second transmission line, and wherein the first flexible printed circuit board may include a fourth transmission line (e.g., a fourth transmission line 364 of FIG. 3) extending from the RFIC and a fifth transmission line (e.g., a fifth transmission line 365 of FIG. 3) electrically connected to the third transmission line and extending from the RFIC.

According to an embodiment, the first path may include the fourth transmission line, the first connector, and the coaxial cable, and the second path may include the first transmission line, the second transmission line, the third transmission line and the fifth transmission line.

According to an embodiment, a part of the fourth transmission line may extend from the RFIC along one surface of a substrate forming the antenna module to one edge of the substrate, and a remaining part of the fourth transmission line may extend from the part of the fourth transmission line positioned at the one edge along one layer of the first flexible printed circuit board to the first connector.

According to an embodiment, a part of the fifth transmission line may extend from the RFIC along one surface of a substrate forming the antenna module to one edge of the substrate, and a remaining part of the fifth transmission line may extend from the part of the fifth transmission line positioned at the one edge along one layer of the first flexible printed circuit board to the second printed circuit board.

According to an embodiment, the electronic device may further comprises a PMIC (e.g., a PMIC 315 of FIG. 3) controlling power of the RFIC, and a sixth transmission line (e.g., a fifth transmission line 365-2 of FIG. 3) extending from the PMIC and electrically connected with the second printed circuit board, wherein the communication processor may provide a control signal to the PMIC through a third path including the second flexible printed circuit board, the second printed circuit board and the sixth transmission line.

According to an embodiment, a part of the sixth transmission line may extend from the PMIC along one surface of a substrate forming the antenna module to one edge of the substrate, and a remaining part of the sixth transmission line may extend from the part of the sixth transmission line positioned at the one edge along one layer of the first flexible printed circuit board to be electrically connected to the second printed circuit board.

According to an embodiment, the RFIC may up-convert the data signal received from the communication processor and transmit the up-converted signal to an external electronic device through the antenna array.

According to an embodiment, a partial area of the first flexible printed circuit board may be disposed on the second printed circuit board, and the first connector may be disposed on the partial area when the first flexible printed circuit board is viewed from the above.

According to an embodiment, the second printed circuit board may further include a second connector (e.g., a second connector 375 of FIG. 6A) distinct from the first connector, the second connector configured to electrically connect the second printed circuit board to the first flexible printed circuit board, and the second connector may be connected to the fifth transmission line.

According to an embodiment, the electronic device may further include a housing (e.g., a housing 301 of FIG. 3), and the housing may include a fixing member (e.g., a fixing member 610 of FIG. 6A) disposed to apply force to one surface of the first connector and the second connector.

According to an embodiment, the housing may include an inner space (e.g., an inner space 601 of FIG. 6A) surrounded by a first surface (e.g., a first surface 301-1 of FIG. 6A), a second surface (e.g., a second surface 301-2 of FIG. 6A) facing the first surface, and a third surface (e.g., a third surface 301-3 of FIG. 6A) disposed along edges of the first surface and the second surface, and the fixing member may protrude from the first surface to the inner space.

According to an embodiment, the second connector may be disposed to face a surface of the first flexible printed circuit board, and the first flexible printed circuit board may be bent from the second connector to extend along one surface of the second printed circuit board to the first connector.

According to an embodiment, the electronic device may further comprises a conductive bracket (e.g., a bracket 302 of FIG. 4) and supporting the first printed circuit board and the second printed circuit board, and the bracket may be configured to be connected to the first printed circuit board, the second printed circuit board, and a conductive heat transfer member electrically connected to the first printed circuit board and the second printed circuit board, and provide a ground to the first printed circuit board or the second printed circuit board.

According to an embodiment, the second printed circuit board may include a coupling member (e.g., a coupling member 378-1 and 378-2 of FIG. 10) disposed spaced apart from a longitudinal edge of the first flexible printed circuit board and fixing the coaxial cable.

According to an embodiment, an electronic device (e.g., an electronic device 300 of FIG. 4) may comprises a housing including a first surface (e.g., a first surface 301-1 of FIG. 6A), a second surface (e.g., a second surface 301-2 of FIG. 6A) facing the first surface, a third surface (e.g., a third surface 301-3 of FIG. 6B between the first surface and the second surface, and an inner space (e.g., an inner space 601 of FIG. 6B) defined by the first surface, the second surface and the third surface; a first printed circuit board (e.g., a first printed circuit board 350 of FIG. 6B) supported by the second surface and including a processor; a second printed circuit board (e.g., a first printed circuit board 330 of FIG. 6A) spaced apart from the first printed circuit board and supported by the second surface; an antenna module (e.g., an antenna module 310 of FIG. 6B) including an antenna array and a flexible printed circuit board; a connector (e.g., a connector 390 of FIG. 6B) formed on one surface of the flexible printed circuit board; and a coaxial cable electrically (e.g., a coaxial cable 380 of FIG. 6B) electrically connecting the flexible printed circuit board and the first printed circuit board via the connector, and transmitting a data signal from the processor to the antenna module; wherein part of the other surface of the flexible printed circuit board may be in contact with the second printed circuit board to be supported by the second printed circuit board and the connector may be disposed thereon.

According to an embodiment, the flexible printed circuit board may include a first transmission line (e.g., a first transmission line 361 of FIG. 3) electrically connecting the antenna module and the first connector, and a second transmission line (e.g., a second transmission line 362 of FIG. 3) electrically connecting the second printed circuit board.

According to an embodiment, the second connector may be electrically connected to the second transmission line, and the housing may include a fixing member protruding from the first surface into the inner space to apply force to the first connector and the second connector, the fixing member disposed to overlap the first connector and the second connector on the second printed circuit board when viewed in a direction from the first surface to the second surface.

According to an embodiment, the electronic device may further comprise a conductive bracket (e.g., a bracket 302 of FIG. 4) in the inner surface and supporting the first printed circuit board and the second printed circuit board, wherein the bracket may be configured to be connected to the first printed circuit board, the second printed circuit board, and a conductive heat transfer member may be electrically connected to a ground of the first printed circuit board and the second printed circuit board.

According to an embodiment, the second printed circuit board may include a coupling member fixing the coaxial cable and disposed spaced apart from the first flexible printed circuit board.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

According to certain embodiments of the disclosure, each component (e.g., a module or a program) of the above-described components may include a single entity or multiple entities, and some of the multiple entities may be separately disposed in different components. According to certain embodiments of the disclosure, one or more of the above-described components may be omitted, or one or more other components may be added. Alternatively or additionally, a plurality of components (e.g., modules or programs) may be integrated into a single component. In such a case, according to certain embodiments of the disclosure, the integrated component may still perform one or more functions of each of the plurality of components in the same or similar manner as they are performed by a corresponding one of the plurality of components before the integration.

Certain of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

While the disclosure has been shown and described with reference to certain embodiments thereof, it will be understood by those skilled in the art that various changes in form and details may be made therein without departing from the spirit and scope of the disclosure as defined by the appended claims and their equivalents.

What is claimed is:

1. An electronic device, comprising:
an antenna module including an antenna array, a radio frequency integrated circuit (RFIC) connected with the antenna array and a first flexible printed circuit board connected with the RFIC;
a first connector disposed on the first flexible printed circuit board;
a communication processor disposed on a first printed circuit board;
a coaxial cable electrically connecting the first flexible printed circuit board and the communication processor through the first connector; and
a second printed circuit board distinct from the first printed circuit board and configured to electrically connect the communication processor and the first flexible printed circuit board;
wherein the communication processor is configured to:
provide a data signal to be transmitted to an external electronic device to the RFIC along a first path in the first flexible printed circuit board through the coaxial cable and the first connector, and
provide a control signal to the RFIC along a second path in the first flexible printed circuit board through the second printed circuit board, the second path being distinct from the first path,
wherein the data signal provided to the RFIC is up-converted in the RFIC based on the control signal, and
wherein the up-converted signal is transmitted to the external electronic device through the antenna array.

2. The electronic device of claim 1, further comprising a second flexible printed circuit board distinct from the first flexible printed circuit board, and configured to connect the first printed circuit board and the second printed circuit board,
wherein the first printed circuit board includes a first transmission line extending from the communication processor,
wherein the second flexible printed circuit board includes a second transmission line electrically connected to the first transmission line,
wherein the second printed circuit board includes a third transmission line electrically connected to the second transmission line, and
wherein the first flexible printed circuit board includes a fourth transmission line extending from the RFIC and a fifth transmission line electrically connected to the third transmission line and extending from the RFIC.

3. The electronic device of claim 2,
wherein the first path includes the fourth transmission line, the first connector, and the coaxial cable, and
wherein the second path includes the first transmission line, the second transmission line, the third transmission line and the fifth transmission line.

4. The electronic device of claim 2,
wherein a part of the fourth transmission line extends from the RFIC along one surface of a substrate forming the antenna module to one edge of the substrate, and
wherein a remaining part of the fourth transmission line extends from the part of the fourth transmission line positioned at the one edge along one layer of the first flexible printed circuit board to the first connector.

5. The electronic device of claim 2,
wherein a part of the fifth transmission line extends from the RFIC along one surface of a substrate forming the antenna module to one edge of the substrate, and
wherein a remaining part of the fifth transmission line extends extend from the part of the fifth transmission line positioned at the one edge along one layer of the first flexible printed circuit board to the second printed circuit board.

6. The electronic device of claim 2, further comprising:
a power management integrated circuit (PMIC) configured to control power of the RFIC; and
a sixth transmission line extending from the PMIC and electrically connected with the second printed circuit board;
wherein the communication processor is configured to provide another control signal to the PMIC through a third path including the second flexible printed circuit board, the second printed circuit board and the sixth transmission line.

7. The electronic device of claim 6,
wherein a part of the sixth transmission line extends from the PMIC along one surface of a substrate forming the antenna module to one edge of the substrate, and
wherein a remaining part of the sixth transmission line is electrically connected to the second printed circuit board and extends from the part of the sixth transmission line positioned at the one edge along one layer of the first flexible printed circuit board.

8. The electronic device of claim 1,
wherein the RFIC is configured to up-convert the data signal received from the communication processor and transmit the up-converted signal to an external electronic device through the antenna array.

9. The electronic device of claim 1,
wherein a partial area of the first flexible printed circuit board is disposed on the second printed circuit board, and the first connector is disposed on the partial area when the first flexible printed circuit board is viewed from above.

10. The electronic device of claim 2,
wherein the second printed circuit board further includes a second connector distinct from the first connector, the second connector configured to electrically connect the second printed circuit board to the first flexible printed circuit board, and
wherein the second connector is connected to the fifth transmission line.

11. The electronic device of claim 1, further comprises a housing including a fixing member disposed to apply a force onto one surface of the first connector.

12. The electronic device of claim 11,
wherein the housing further includes an inner space surrounded by a first surface, a second surface facing the first surface, and a third surface disposed along edges of the first surface and the second surface, and the fixing member is configured to protrude from the first surface toward the inner space.

13. The electronic device of claim 10,
wherein the second connector is disposed to face a surface of the first flexible printed circuit board, and
wherein the first flexible printed circuit board is configured to be bent from the second connector and extend to the first connector along one surface of the second printed circuit board.

14. The electronic device of claim 1, further comprising a conductive bracket configured to support the first printed circuit board and the second printed circuit board,
wherein the bracket is further configured to be connected to the first printed circuit board, the second printed circuit board, and a conductive heat transfer member electrically connected to the first printed circuit board and the second printed circuit board to provide a ground to the first printed circuit board or the second printed circuit board.

15. The electronic device of claim 1,
wherein the second printed circuit board further comprises a coupling member configured to fix the coaxial cable, the coupling member spaced apart from a longitudinal edge of the first flexible printed circuit board.

16. An electronic device, comprising:
a housing including a first surface, a second surface facing the first surface, a third surface between the first surface and the second surface, and an inner space surrounded by the first surface, the second surface, and the third surface;
a first printed circuit board supported by the second surface and including a processor;
a second printed circuit board spaced apart the first printed circuit board and supported by the second surface;
an antenna module including an antenna array and a flexible printed circuit board;
a first connector formed on one surface of the flexible printed circuit board; and
a coaxial cable electrically connecting the flexible printed circuit board and the first printed circuit board via the first connector, and configured to transmit a data signal from the processor to the antenna module,
wherein a part of another surface of the flexible printed circuit board is in contact with the second printed circuit board to be supported by the second printed circuit board.

17. The electronic device of claim 16, wherein the flexible printed circuit board further comprises a first transmission line electrically connected to the antenna module and the first connector, and a second transmission line electrically connected to the second printed circuit board.

18. The electronic device of claim 17,
wherein the electronic device further comprising a second connector distinct from the first connector, and
wherein the housing further comprises a fixing member protruding from the first surface toward the inner space to apply a force to the first connector and the second connector, and the fixing member disposed to overlap the first connector and the second connector on the second printed circuit board when viewed in a direction from the first surface to the second surface.

19. The electronic device of claim 16, further comprising a conductive bracket disposed in the inner surface and configured to support the first printed circuit board and the second printed circuit board;
wherein the bracket is configured to be connected to the first printed circuit board, the second printed circuit board, and a conductive heat transfer member electrically connected to a ground of the first printed circuit board and the second printed circuit board.

20. The electronic device of claim 16, wherein the second printed circuit board further comprises a coupling member configured to fix the coaxial cable, the coupling member spaced apart from the flexible printed circuit board.

* * * * *